United States Patent [19]
Girgis

[11] Patent Number: 5,343,404
[45] Date of Patent: Aug. 30, 1994

[54] PRECISION DIGITAL MULTIMETER AND WAVEFORM SYNTHESIZER FOR MULTI-SIGNALS WITH DISTORED WAVEFORMS EMBEDDED IN NOISE

[75] Inventor: Girgis A. Girgis, Omaha, Nebr.

[73] Assignee: Maritec Corp., Omaha, Nebr.

[21] Appl. No.: 975,470

[22] Filed: Nov. 12, 1992

[51] Int. Cl.$^5$ .................... G01R 13/00; G06F 15/20
[52] U.S. Cl. ................. 364/484; 364/728.07; 364/728.03; 324/623; 324/76.11
[58] Field of Search ............... 364/481, 484, 485, 487, 364/572, 715.01, 724.01, 728.03, 728.07; 324/616, 620, 623, 709, 77 R, 77 B, 77 G

[56] References Cited

U.S. PATENT DOCUMENTS

| | | | |
|---|---|---|---|
| 1,708,544 | 4/1929 | Kummerer | 329/83 R |
| 2,213,099 | 8/1940 | Adorjan | 171/95 |
| 3,005,151 | 10/1961 | Ule | 324/57 |
| 3,016,475 | 1/1962 | Kirsten | 315/84.6 |
| 3,019,390 | 1/1962 | MacMillan | 324/83 |
| 3,249,868 | 5/1966 | Sheftelman | 324/83 |
| 3,281,846 | 10/1966 | King, Jr. | 343/107 |
| 4,277,748 | 7/1981 | Gerst et al. | 324/83 |
| 5,014,318 | 5/1991 | Schott et al. | 381/47 |
| 5,089,782 | 2/1992 | Pike et al. | 324/623 |
| 5,272,723 | 12/1993 | Kimoto et al. | 364/724.19 |

OTHER PUBLICATIONS

Reynolds, "Measure phase noise in one of three ways, each of which has some advantages, Quadrature phase detection avoids dynamic-range limits," *Electronic Design*, Feb. 15, 1977, 106-108.

Girgis, "Reactive Power Calculations Using Quadratic Phase Coupling Estimation," Conference Record of IEEE Instrumentation and Measurement Technology Conference, IMTC/91, 598-601.

*Primary Examiner*—Vincent N. Trans
*Attorney, Agent, or Firm*—John A. Beehner

[57] ABSTRACT

Electrical signals suffer usually from distortion and noise. This invention gives a very precise and simple digital circuitry as well as basis for software to measure the phase difference between harmonic components of any of two of the input signals. The apparatus may be used also for measuring the voltage, current, impedance, apparent power, active power, reactive power, total harmonic distortion or distortion of preselected harmonics in any two of a plurality of test signals, auto-correlations and cross-correlations for any subset of the input signals. The apparatus may also be used to analyze the amplitude of harmonic components, to filter DC or specific harmonic components of any of the result in an analog or digitized waveform, and to measure object distance for radar, sonar, and telecommunication applications. The apparatus design is based on modern digital signal processor chips and multi-processors operation.

33 Claims, 12 Drawing Sheets

PRECISION DIGITAL MULTIMETER AND WAVEFORM SYNTHESIZER FOR MULTI-SIGNALS WITH DISTORED WAVEFORMS EMBEDDED IN NOISE

BACKGROUND OF THE INVENTION

1. Technical Field

In the course of electrical signal transmission, certain unwanted and undesirable effects take place. One is attenuation, which reduces the signal strength; more serious, however, are distortion, interference, and noise, which appear as alterations of the signal shape. Broadly speaking, any unintended signal perturbation may be classified as "noise", and it is sometimes difficult to distinguish the various offenders in a contaminated signal. Distortion is signal alteration due to imperfect response of the system to the desired signal itself. Unlike noise and interference, distortion disappears when the signal is turned off. Interference is contamination by extraneous signals, usually manmade, of a form similar to the desired signal. The problem is particularly common in broadcasting, where two or more signals may be picked up at the same time by the receiver. Noise means the random and unpredictable electric signals which come from natural causes, both internal and external to the system. When such random variations are added to an information-bearing signal, the information may be partially masked or totally obliterated. Of course the same can be said for interference and distortion; what makes noise unique is that it can never be completely eliminated, even in theory. Noneliminable noise poses one of the basic problems of electrical communication.

The present invention relates to precise measurement of phase angles between harmonic components of two general distorted signals embedded in measurement noise. The invented phase measurement method is simple and is implemented in the design of a new instrument capable of measuring: amplitude of harmonic components of the two input signals and phase shifts between the corresponding harmonic components of the input signals. If the input signals represent voltage and current in a network then the new instrument can measure precisely voltage, current, load impedance, the active power and reactive power of the network. The invention relates also to harmonic distortion measurement and filtering of preselected harmonic components. The apparatus design will be described, which can be used for telecommunication applications such as to find the percentage modulation in transmitting communication units and demodulation of the received signals or to find digital time-of-flight measurement from ultrasonic sensors to measure object distance in air and flow velocity.

2. Description of the Prior Art

Conventionally, the phase of a signal is measured by using what may be termed the "null technique." The null technique involves the shifting of the phase of the test signal whose phase is being measured until a device such as phase detector indicates that signal is in quadrature with a reference signal. Such a point is indicated by the null output of the detector. The amount of phase shift required to reach null indicates the phase shift of the input test signal.

Sheftleman, U.S Pat. No. 3,249,868, addresses phase measurement of noise-contaminated signal. Generally, the apparatus of Sheftleman's invention includes a pair of phase detectors which are driven in quadrature by separate reference voltages. The ratio of the average outputs of phase detectors is measured to provide an indication of phase displacement. The two phase detectors are supplied with the same input signal. More specifically, the average outputs from the pair of phase detectors are compared in a threshold device to indicate their ratio. This ratio is a function of the phase displacement of the input signal applied to the two phase detectors. There are two principal disadvantages in the threshold circuit technique. First, the operator needs to compute the ratio of the two meter readings, and second, the length of time required for one of the thresholds to be reached depends on the amount of noise present with the signal. The circuit adds two different noise levels in each phase detector circuit due to the amount of noise present in the reference signals.

Kummerer, U.S. Pat. No. 1,708,544, described a method and arrangement for measuring frequency and frequency variations in alternating currents. It also embraces a method and means for the comparison of the phase relation of two alternating currents. A phase change of detuning of an oscillation circuit with relation to an excitation source of oscillation is utilized. This is done in combination with a Wheatstone bridge arrangement which is built such that the resistances of the different bridge arms or branches are influenced by the phase-displaced currents of an excitation circuit and of an excited circuit. The supply of current to the bridge is such that in the presence of a phase displacement of the current of exactly 90 degrees (quadrature) as occurring at resonance, the effective values of the currents flowing in the bridge arms are equal. The bridge arms contain resistances which change with heating. The bridge furthermore is fed from a direct current source. The zero position of the output is influenced by noise. Harmonic components of the waveforms are not considered but they affect the change of the resistances of the arms.

Adorjan, U.S. Pat. No. 2,213,099, developed a distortion indicator for electrical amplifying systems, particularly thermionic amplifying systems. The test signal to be amplified is applied to the terminals of a thermionic amplifier, the output terminals of which feed a load circuit. A fraction of the input voltage is obtained by means of an attenuator which, after passing through a filter, is applied to a bridge rectifier circuit. The unidirectional output of the rectifier is then applied to two wound moving coils rigidly secured together at right angles and disposed in a magnetic field produced by a permanent magnet. By suitable adjustment of the attenuators, the currents in the coils may be adjusted so that the torque-producing effects of the two currents exactly balance each other. Provided that the ratio of the output to input voltages remains the same, the ratio of the rectified voltages will be unaltered and no deflection of the pointer occur. If, however, there should be a change of ratio of output to input voltages, then there will be a deflection of the pointer and this indicates the amount of distortion being produced by the amplifier. This method is limited by the sensitivity with the moving coils system and the adjustments which can be made in the attenuators. Further, this method cannot give the distortion due to preselected harmonics.

Diehl, U.S. Pat. No. 2,986,700 developed a circuit for determining whether the phases of carrier voltages are in phase quadrature. The circuit includes a balanced modulator to which a pair of carrier voltages in quadrature phased relationship are applied and from which a small amount of second harmonics of the applied carrier voltages is obtained. The circuit also comprises a single tuned amplifier selectively responsive to amplifying the second harmonics of the applied carrier voltages. This circuit cannot be used except for carrier frequency signals with phase difference of 90 degrees.

Ule, U.S. Pat. No. 3,005,151, invented a phase measurement method for a sinusoidal signal passing through a network under test. This method relies on generating a sinusoidal voltage and an alternating signal having substantially the same half-periods, and impressing the sinusoidal voltage on the network to produce a signal at the output of the network. The generation of the alternating signal is stopped at a time when the amplitudes of the alternating and output signals bear a predetermined relationship with respect to each other, and restarted at a time when the amplitudes of the signals cease to bear the predetermined relationship with respect to each other. The length of time that the generation of the alternating signal is stopped is then used to measure the signal's phase. The major disadvantage of this method is that it does not discriminate between the noise effects or the distortion effects on the signal.

Kirsten, U.S. Pat. No. 3,016,475, relates to an electronic counting circuit and more particularly to a system for indicating the net accumulated phase difference between two continuing input signals. The circuit registers count either additive or subtractive depending upon the direction of phase change. The major disadvantage is that the two signals must have the same frequency or cycle's time and that they must be free from distortion and measurement noise.

MacMillan, U.S. Pat. No. 3,019,390, provides a system for measuring the phase of an unknown signal in which a reference signal source supplies AC sinusoidal voltage having a controllable phase shift between zero and 360 degrees. The system includes a DC comparator and chopper amplifier, phase rectifier and filter, and sine and cosine potentiometers. The mode of operation provides an automatic and continuous control of the input amplifier, wherein the two voltages are applied to the comparator and chopper amplifier. Initially, for a specific frequency, the phase of one input voltage is adjusted to zero while the other is set to 90 degrees. The input voltages are precisely equal in amplitude. Each of the two rectifier-filters provides a DC voltage to cause a change in the charge of a coupling capacitor. The system automatically and continuously controls an amplifier so that an AC output voltage results which is always precisely equal in amplitude and 90 degrees phase shift to the AC input voltage, regardless of frequency variation. This method requires a special reference signal and is subject to the same disadvantages as of the Ule and Kristen inventions.

King, U.S. Pat. No. 3,281,846, provides an apparatus for comparing the amplitudes of two alternating current signals differing from one another in frequency. A half-wave or balanced modulator type of phase discriminator, is used to generate two output signals to feed a balanced network. A meter will move to the left or right of center depending upon the phase of the signal. This method can be used for measuring the ratio between any two harmonic components. In order to accomplish this, the distorted input signal has to pass through two parallel branches of a bandpass filter tuned to one of the harmonic frequencies. King's invention cannot be used for measuring the phase differences of harmonic components or can cancel noise effects.

Gerst et al, U.S. Pat. No. 4,277,748, provides an angle digitizer from a signal representing the sine and cosine of the angle to be digitized. The voltages are fed to orthogonal pairs of input terminals between which are a set of equivalued resistors forming a resistor ring. At the junction of each pair of resistors is an output terminal. Each pair of output terminals is connected to the input terminals of a signal amplitude comparator which compares the magnitude of the signals at its inputs to give a digital signal in accordance with which is greater. For each comparator, the output terminals of the resistor ring are selected such that the signals are in a direct antiphase relationship. This invention is limited in application to pure sine or cosine waveforms not embedded in noise.

C. Reynolds described three techniques for measuring phase-noise sidebands in his article, "Measure phase noise in one of three ways, each of which has some advantages. Quadrature phase detection avoids dynamic-range limits" 25 *Electronic Design,* 106–108, Feb. 15, 1977, using frequency analyzers with dynamic ranges of 160 dB and 1-Hz bandwidths in the gigahertz region. The techniques used are rf-spectrum measurement, frequency discrimination and quadrature-phase detection. To improve frequency resolution, the carrier frequency component is eliminated. To improve resolution in a phase-noise measurement, a mixer and low-pass filter shift signal frequencies down. In practice, phase-noise analysis often covers a frequency range greater than that of a single selective analyzer. Consequently, two analyzers can be used. Two units covering the range of 5 Hz to 13 MHz, for example, can test a 10 MHz synthesized source, using a phase-locked system. To improve noise measurements, an automatic spectrum analyzer may be selected with a calculator controller covering the range from 100 Hz to 1 MHz. The programmable power of such a system allows the user to select points that avoid discrete signals and thus quickly determine a phase-noise-sideband envelope over a wide frequency range. The key to this capability is a programmable synthesizer combined with a tracking analyzer that features digital readout and output, rather than a built-in cathode ray tube (CRT). The automatic analyzer's internal structure is similar to most spectrum analyzers. The programmable calculator, through software written by the operator, controls both analyzer and synthesizer over a bidirectional interface. The calculator manipulates data received from the analyzer and plots the normalized, corrected results on an optional digital plotter. Although these three methods can be used for measuring the amplitude of harmonic components, they cannot be used for measuring the phase shifts of harmonic components.

None of the above inventions or methods above describes a method for the measurement of the amplitudes of the harmonic components of two input signals as well as the phase shift between the harmonic components of the two input signals.

Accordingly, it is a primary objective of the invention to present an instrument based on a new design capable of measuring and analyzing multi-distorted signals subject to measurement noise and extract useful signal characteristics for any two of the input signals.

Another objective of the invention is to provide an apparatus for processing two input signals: first signal and second signal wherein the input signals may represent the voltage and the current in a power network and wherein the waveforms of the input signals are assumed to be distorted and contain a measurement noise component.

Another objective of the invention is to present an instrument capable of measuring certain harmonic components of first test signal or a sum of certain preselected harmonics.

Another objective of the invention is to present an instrument capable of measuring certain harmonic components of second test signal or a sum of certain preselected harmonics.

Another objective of the invention is to present an instrument capable of measuring the phase angle between the corresponding harmonic components of two input test signals.

Another objective of the invention is to present an instrument capable of measuring the active or reactive power in a power network wherein the two input signals represent the applied input voltage and the current in the network.

Another objective of the invention is to present an instrument capable of measuring the total harmonic distortion for any two of the input signals in analog form or in digitized form.

Another objective of the invention is to present an instrument capable of providing an output having a filtered waveform from any of the input signals by filtering out DC components of signal or preselected harmonic components.

Another objective of the invention is to present an instrument capable of finding the time difference between emitted wave and echoes, using cross correlation algorithms involved in the design of the apparatus, from the inspection of the peak of the cross correlation function of emitted wave and echoes.

Another objective of the invention is measuring load impedance being determined from the ratio of voltage and current across the impedance at a given harmonic frequency thereof by applying voltage and current signals to the inputs of the apparatus.

Another objective of the invention is measuring the impedance of a multi-phase network as well as the comparison of each phase impedance to detect any unbalance in the multi-phase network, or identify fault modes in the multi-phase network.

A final objective of the invention is the use of the apparatus for telecommunication applications such as to find percentage modulation in transmitting communication units and demodulation of the received signals from the amplitudes and phase shifts of harmonic components of the test signals.

SUMMARY OF THE INVENTION

The method of measuring phase angles between two input test signals, having harmonic components and embedded in measurement noise, of the present invention comprises providing a signal processing apparatus for determining phase angles between harmonic components of any two of the incoming test signals, the apparatus having a signal processing means, a multiplexer means, interface means, computation control means, and function control means all electrically connected. A first and second incoming input test signal is selected from a plurality of test signals and the first and second test signals are converted into a proper format for processing by the interface means and are then input into the signal processing means. A series of N autocorrelation function equations for each of the first and second test signals are computed by the signal processing means. DC and N-1 harmonic components of the test signals are determined by simultaneously solving the linear system of equations resulting from the autocorrelation function equations. A new data set is created from the DC and harmonic components of the test signals wherein the new data set has quadratic phase coupling between the harmonic components of the two test signals. Third order cumulants of the new data set are then calculated and the third order cumulants are used to compute phase shifts between the harmonic components of the two test signals. The results of the signal processing are then output by means of the interface means.

The apparatus of the present invention may also measure phase angles between harmonic components of two test signals having harmonic components and being embedded in noise. The apparatus comprises a multiplexer means for selectively choosing a first and second test signal, a signal processing means for processing of the input test signals, and an interface means electrically connected to the signal processing means for converting the input test signals into a format for use by the signal processing means. A computation control means is electrically connected to the interface means and signal processing means and controls the input of the first and second test signals to the signal processing means. A function control means is electrically connected to the computation control means and provides control to the signal processing means for display of the processed signal data. The function control means also controls computation of various relationships between the first and second test signals and allows retrieval and display of data computed by the signal processing means.

DESCRIPTION OF THE PREFERRED EMBODIMENT

I. BACKGROUND

Figure 1A:
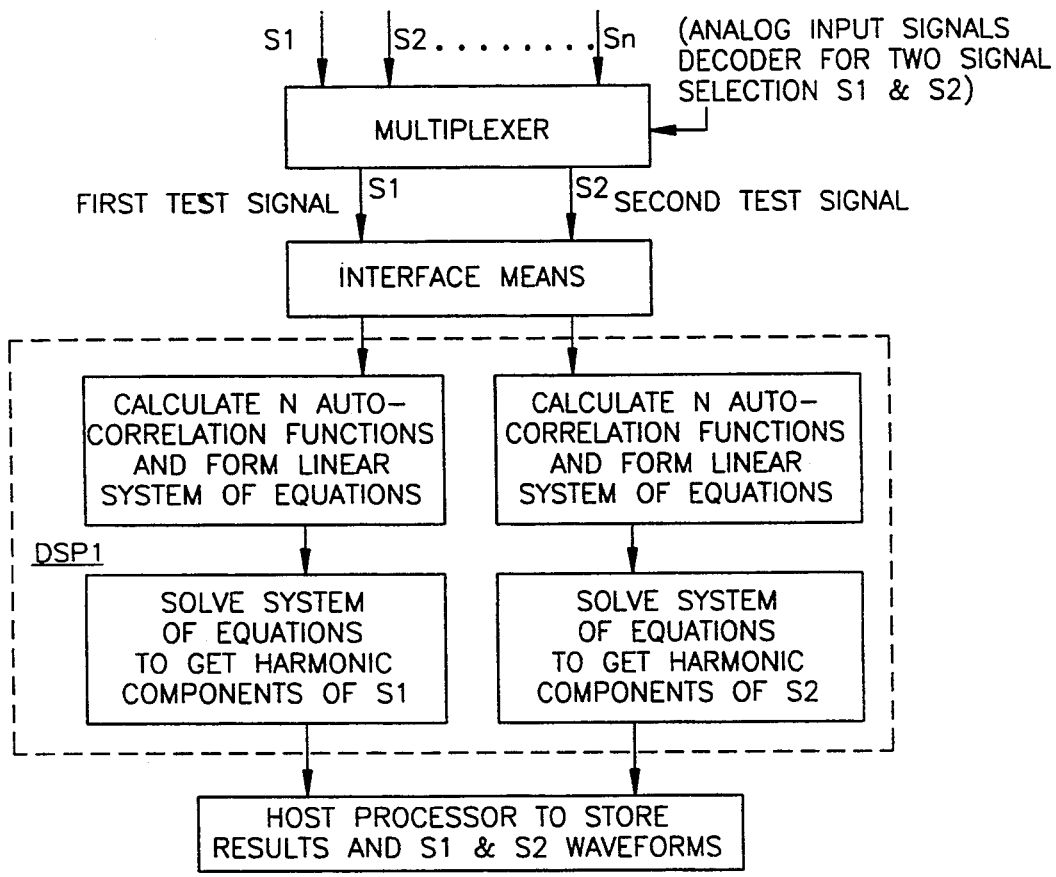
FIG. 1a shows the flowchart for the calculation of the harmonic components of the waveforms of the two multiplexed signals (the output of block 1 of FIG. 3) using autocorrelation functions of the data streams representing the multiplexed signals. This flowchart helps in programming the program memory of DSP1 (block 13 of FIG. 3).

Perfect signal identification might be possible in the absence of noise and other contaminations, but noise is always present in electrical systems. Further, these superimposed noise perturbations limit our ability to correctly identify the intended signal and therefore limit information transmission. Why is noise inevitable? Curiously, the answer comes from kinetic theory. Any particle at a temperature other than absolute zero has thermal energy, manifested as random motion or thermal agitation. If the particle happens to be an electron, its random motion constitutes a random current. If the random current takes place in a conducting medium, a random voltage, known as thermal noise or resistance noise, is produced. Typically, noise variations are quite small, on the order of microvolts. If the signal variations are substantially greater, say several volts peak to peak, then the noise may be all but ignored. Indeed, in ordinary systems under ordinary conditions, the signal-to-noise ratio is large enough for noise to go unnoticed. But in long-range or minimum-power systems, the received signal may be as small as the noise or smaller. When this happens, the noise limitations becomes very real. Consequently, the ability to remove or separate this noise contamination from the desired signal is a constant goal in any electromagnetic or electric signal transmission. Applying the techniques disclosed here results in the accomplishment of this goal and the benefits which follow.

II. DESIGN BASICS

A. Introduction

In the real world, electrical communication signals are usually distorted and embedded in noise. Spectral analysis, using precise measurements of signals and their spectra, is a powerful tool in communication engineering and can be used to separate the desired signal from the unwanted noise. The next paragraph gives t some typical signals in communication systems.

It is often desirable to transmit several messages on one transmission facility, a process called multiplexing. There are two basic multiplexing techniques: frequency-division multiplexing (FDM) and time-domain multiplexing (TDM). The principle of FDM is to individually modulate the sum of the subcarriers. Message recovery or demodulation of FDM signals is accomplished by carrier demodulation and filtering with parallel branches of band pass filters. The FDM method is used in commercial FM stereophonic broadcasting. The major problem of FDM is cross-talk, the unwanted coupling of one message into another. Intelligible cross talk (cross modulation) arises primarily because of non-linearities in the system, which cause one message signal to partially modulate another subcarrier. Equally disturbing is the unintelligible cross talk due to imperfect spectral separation by the filter bank.

In exponential modulation (EM), the modulated wave in phasor form is an exponential function of the message, that is, $$y_o = A_c \cos(2\pi ft + \Psi) \tag{1}$$

so that the carrier frequency f is uniquely specified. The second term $$\Psi$$

can then be interpreted as a relative phase angle. The two known forms of exponential modulation are namely, frequency modulation (FM) and phase modulation (PM). The FM modulated wave can be represented by $$y_o(t) = A_c \cos(2\pi ft + \beta \sin(2\pi f_o t)). \tag{2}$$

In phase modulation (PM), we take the modulating signal with a frequency $f_m$ to be a sine wave rather than a cosine wave. Then, with the phase $$\Psi = \Psi_d A_m \sin(2\pi f_m t), \tag{3}$$

the modulated wave given by equation (1) becomes $$y_o(t) = A_c \cos(2\pi ftC + \Psi_d A_m \sin(2\pi f_m t)). \tag{4}$$

Because of the constraint $$\Psi_d \approx \pi,$$

there is no "wideband" PM.

Measuring the amplitude and the phase of the harmonic components of the FM, PM, and EM type of signals listed above is one of the applications for this invention.

Another application of the present invention is measurement of waveforms in networks containing power electronic components such as silicon controlled rectifiers (SCRs), triacs, diodes, and the like. These power electronic components introduce a considerable amount of distortion and noise. Precision measurement of active and reactive power components in a power network is a target of power utilities as well as their customers. The new invention could be used also in research labs and the fields of sonar, radar, and biomedical engineering. The design principle of the new invention will be described in Section IV. Hardware description and detailed description of Figures will be given in Section V. Examples of some of these applications and description of the algorithms needed to program the host processor and the two digital signal processors are given below in Sections IV and VI.

The present invention allows the user to detect and isolate the phase shift between any harmonic components of two incoming signals which are embedded in noise. A plurality of test signals are input to the apparatus and multiplexer circuit selects any of two channels of the incoming signals. The selected signals are then processed according to the disclosed process and the desired data are extracted.

B. Principles of Signal Processing Used in the New Design

There are situations in practice where because of interactions between two harmonic components of a signals, there is contribution to the signal's power at the sum and/or difference of the harmonic frequencies. Such a phenomenon, which could be due to quadratic nonlinearities, gives rise to certain phase relations called quadratic phase coupling.

The two multiplexed signals do not originally have the quadrature phase coupling property. Rather, quadratic phase coupling is generated by the present invention. The instrument measures and processes a new finite set of data related to the two input channels, wherein the desired information is obscured by noise. The new data is constructed so that it has quadratic phase coupling to the two input signals. This permits the recovery of phase shifts between the harmonic components of the incoming signals.

Additional details of this process are described below. Quadratic phase coupling is a result of phase relationships which develop because of interactions between two harmonic components of the incoming signals. These interactions may be due to quadratic irregularities, contributing to power at the harmonic's sum and or difference frequencies. Although the two input signals do not have the quadrature phase coupling due to their generality, the inventions' digital signal processing units start to form a new set of data, related to the two input signals, which has a quadratic phase coupling property for a certain harmonic order. Thus, it is possible to measure the phase shift of the corresponding harmonic components of the specified harmonic order for any two input signals containing measurement noise.

The present invention comprises two modes of operation, multimeter mode and the waveform synthesizer modes. The multimeter mode of operation can be used to measure: current, voltage, total harmonic distortion in any of the input signals, the effective value of a preselected sum of harmonics, phase shift of the corresponding harmonic components of the input signals, impedance, active power, and reactive power.

The waveform synthesizer mode of operation allows measurement of the following: phase angle and amplitude of certain harmonic components of any of the input signals or a sum of certain preselected harmonics, phase angle between corresponding harmonic components of the input signals, filtering of DC component or preselected harmonics, the total harmonic distortion of any of the two input waveforms and the cross correlation between any two input signals.

C. Preferred Hardware Circuits

A digital signal processor (DSP) is a microprocessor with an architecture that has been optimized for the implementation of digital signal processing algorithms. Additional details of the DSP and associated interface is found in Section V. The main feature of DSP chips is the multiply and accumulator (MAC) operation, which is central to the implementation of discrete-time systems. Other features include extensive pipelining and parallelism, independent memories, and "circular" and "bit-reversed" addressing modes. Most DSPs use the so-called "Harvard architecture", where data and instruction are kept in separate memories to allow for the execution of several operations in parallel. Some processors have two data memories, denoted X and Y. The X memory can be used to store the input signal samples and the Y memory to store design parameters. In the preferred embodiment, the DSPs are a Texas Instruments TMS320C30 for the first signal processor and an ADSP 21020 from Analog Devices for the second signal processor but may be any of a variety of types. The special architecture and the extensive pipelining and parallelism of many DSPs makes their programming quite difficult. However, this is changing with the development of friendlier software tools such as high level language compilers, software simulators, and computer-aided software engineering (CASE) tool for DSPs.

As mentioned above, the multiplier-accumulator (MAC) unit is the key element of a DSP with either fixed-point or floating point multipliers are available. Computation of the autocorrelation functions, and computation of every output sample involves a series of multiply, accumulate, and data shift operations. DSPs can accomplish these three operations simultaneously by a single-cycle, "multiply/accumulate and shift-data" instruction. This type of instruction is very useful because many digital signal processing algorithms include summation of products. The computations can be further accelerated by replacing the "DO loop" with straight-line code, thus avoiding the overhead associated with the loop control. The choice between execution time and program memory (space-time trade-off) depends on the application and the available resources and its presence in any algorithm implementation. Some digital processors have a special repeat instruction which allows a limited number of repetition times without loop control overhead. Most processors attain additional performance by using some kind of pipelining. Several DSPs use circular addressing, which is a way to implement circular addressing using a circular buffer that keeps at the forefront the most recent data to be processed.

Digital Signal processors (DSPs) also have a variety of serial ports. Serial ports are used for two basic purposes, interfacing the DSP with the host processor and interfacing analog-to- digital (A/D) and digital-to-analog (D/A) converters or Analog interface circuit (AIC) for the system. FIGS. 4 to 11 show the preferred hardware circuits for implementing this invention and will be described in detail in Section V. As is well understood in the art, there are many ways to interface the various hardware components while implementing the computational techniques of the present invention.

D. Preferred Software Design Method

As is also well understood in the art, there are a variety of software development tools to aid the designer in implementing a particular design. For example, the development systems include software tools for programming and software debugging and emulators for system debugging such as:

(1) The C Compiler reads source file written in ANSI-standard C language. The compiler outputs DSP assembly language files.

(2) The numerical C Compiler is DSP's implementation of ANSI-standard Numerical C, a set of extensions to C to allow matrix data types and operators. The compiler outputs DSP assembly language files. With DSP/C, signal processing algorithms are easier to program and the compiled code is more efficient because the compiler directly translates matrix operations in Numerical C to the matrix format of the DSP.

(3) The assembler inputs a file of DSP source-code and assembler directives, and outputs a relocable object file. The assembler supports standard C preprocessor directives as well as its own directive.

(4) The linker processes separately assembled object and library files to create a single executable program. It assigns memory locations to code and data in accordance with a user-defined architecture file, a text file that describes the memory configuration of the target system.

(5) The assembly library contains standard arithmetic and DSP routines that may be called from the main program, saving development time. Additional routines may be added to this library using the librarian function.

(6) The simulator executes a DSP executable program in software in the same way that a DSP processor would do in hardware. The simulator also simulates the memory and I/O devices specified in the architecture file. The window-based user interface allows interactive observation and alteration of the data in the processor and in memory. Thus the designer is allowed to completely test the design and architecture prior to actually realizing the system design.

(7) The "PROM splitter" (the name used for Analog Devices DSPs) translates a DSP executable program into one of several formats (Motorola S2 and S3, Intel Hex Record, etc.) that can be used to configure a PROM or be downloaded to a target from a host processor.

(8) The In-Circuit Emulator (ICE) provides hardware debugging of a DSP system with stand-alone in-circuit emulation. The emulator design provides execution with little or no degradation in processor performance. The emulator uses the same window-based user interface as the simulator to speed up learning. The emulator communicates with the target processor through the processor's test access port.

Figure 1B:
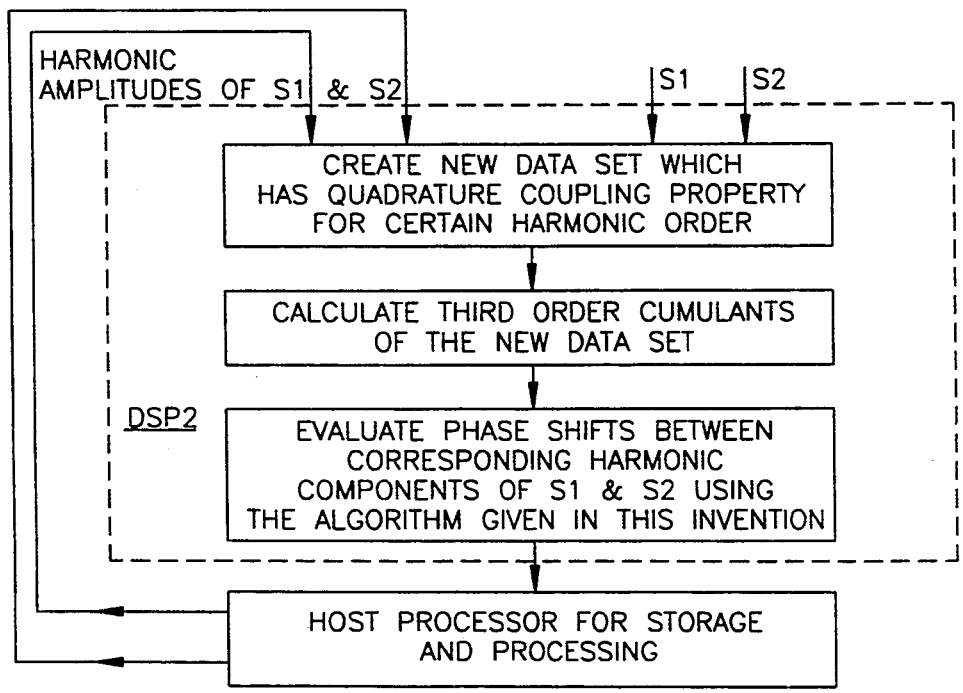
FIG. 1b shows the flowchart for the calculation of the phase shifts between the corresponding harmonic components of the multiplexed signals using the cumulants (third order statistics) of the data streams of a new data set for programming DSP2 as represented by block 15 of FIG. 3. This flowchart helps in programming the program memory of DSP2.
Figure 1C:
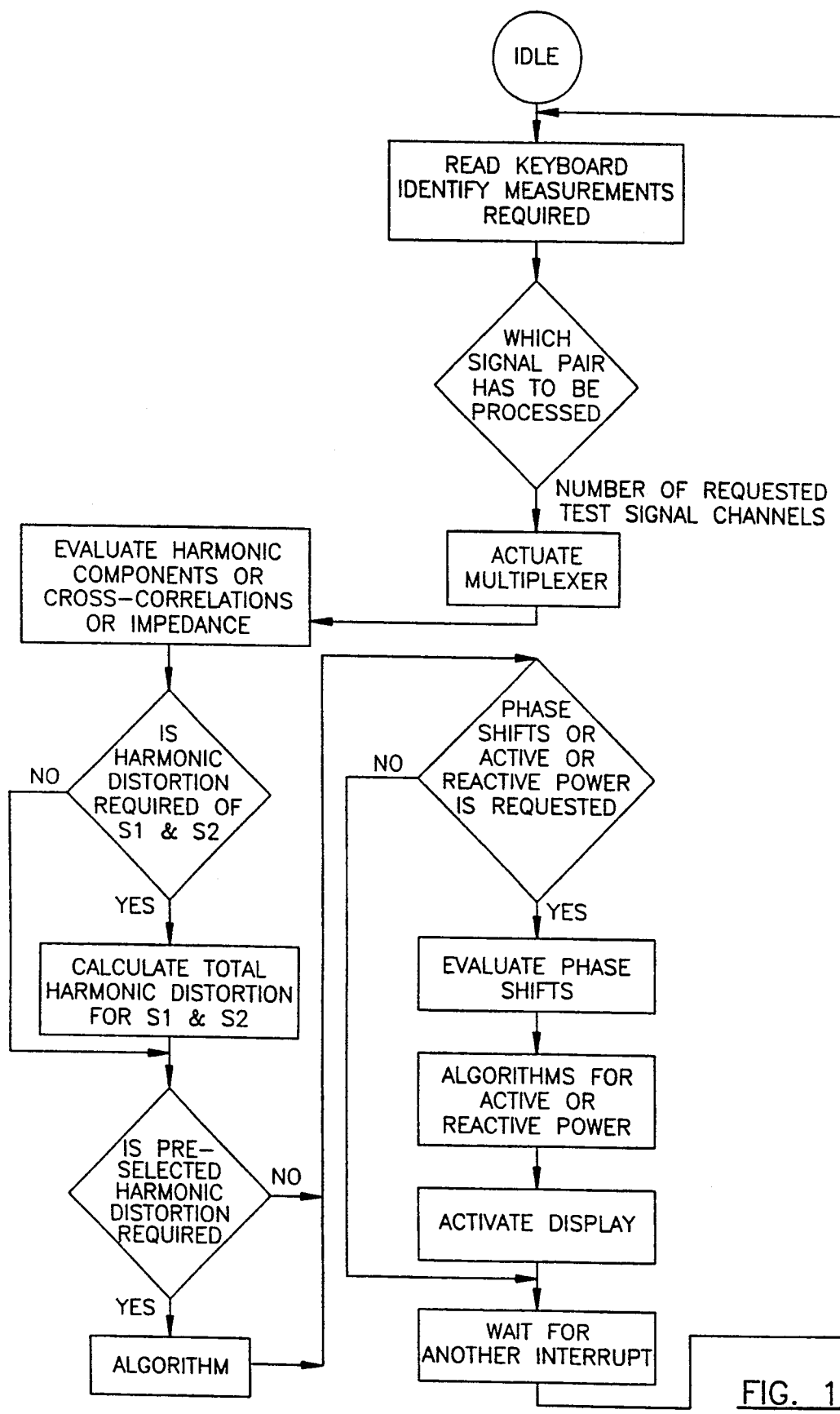
FIG. 1c shows the flowchart for programming the host processor for the required calculations of each multiplexed signal which may be the total harmonic distortion, the effective value of preselected harmonics, the active or reactive power, impedance, detection of unbalance of load impedance or fault condition, signal synthesis or filtering. This helps in programming the program memory of the host processor shown in block 8 of FIG. 3.

The required algorithms for extracting the desired measurements mentioned above including, the voltage and current of selected harmonics, phase angles, active and reactive power computations and harmonic distortion will be given in Section IV. Other algorithms for other applications will be given in Section VI. FIGS. 1a, 1b and 1c show flowcharts for implementation of the signal processing methods of the present invention. Details of the implementation algorithms follow.

III. Theory of Harmonic Components Evaluation and Phase Shift Between Harmonics of any Two Input Signals

A. Definitions

Analog to digital (A/D) conversion involves a sampling operation wherein a sequence y(n) is obtained by periodically sampling an analog signal. The samples y(n) or y(nT), where T is the sampling period and n is an integer and 1/T is the sampling frequency or sampling rate, are samples of y(t) at a time of nT.

1) Autocorrelation function

The power spectrum for each of the voltage and the current waveforms is calculated using the autocorrelation function $R_y(k)$ of a tested signal data stream y(n)

$$R_y(k) = E\{y(n)y(n+k)\} \quad (5)$$

where the E operator means expectation, and y(n+k) is data sampled at time of (n+k)T.

Thus, the correlation function is found by taking a signal, multiplying it by the same signal displaced kT units in time, and averaging the product over all the time.

The autocorrelation of the sinusoidal wave $$y(n) = A \cos(\omega_0 nT + \gamma), \quad (6)$$

which is periodic in $$T_0 = 2\pi/\omega_0 \quad (7)$$

is $$R_y(n) = (A^2/2) \cos(\omega_0 nT). \quad (8)$$

It is noted that the autocorrelation function is independent of the phase angle $$\gamma$$

of y(n).

2) Third-order cumulant

The third-order cumulant $c_y(k,l)$ of a data stream y(n), is the third-moments sequence, and is performed on the new data set. The third-order cumulant sequence is defined by $$c_y(k,l) = E\{y(n)y(n+k)y(n+l)\}, \quad (9)$$

where E means expectation, y(n+k) is data sample offset by kT, and y(n+l) is data sample offset by lT.

3) Autocorrelation function and power spectrum of a waveform defined by a sum of harmonics Let a sampled data stream y(n) be defined as the sum of three harmonic frequencies $f_1$, $f_2$, and $f_3$ and a unit sampling period T, i.e., the frequencies $f_1$, $f_2$, and $f_3$ are the ratios between actual frequencies and the sampling frequency.

$$y(n) = A_1 \cos(f_1 n) + A_2 \cos(f_2 n) + A_3 \cos(f_3 n). \quad (10)$$

The autocorrelation function of y(n) is given by $$r_y(k) = 0.5(A_1^2 \cos(f_1 k) + A_2^2 \cos(f_2 k) + A_3^2 \cos(f_3 k)) \quad (11)$$

4) Third-Order cumulants and quadratic phase coupling

Let a sampled data stream y(n) be represented by $$y(n) = A_1\cos(\omega_1 n + v_1) + A_2\cos(\omega_2 n + v_2) + \quad (12)$$
$$A_3\cos(\omega_3 n + v_3) + B_1\cos(\omega_1 n + u_1) +$$
$$B_2\cos(\omega_2 n + u_2) + B_3\cos(\omega_3 n + u_3),$$

where, $$\omega_3 = \omega_1 + \omega_2, \quad (13)$$

and $$v_3 = v_1 + v_2. \quad (14)$$

The frequencies $$(\omega_1, \omega_2, \omega_3) \quad (15)$$

are called a bifrequency. The phase of the bifrequency satisfies a similar relation as that for frequencies and phase shifts described by equations 13 and 14.

The autocorrelation sequence for the signal y(n) of (12) is given by $$r_y(k) = P_1 \cos(\omega_1 k) + P_2 \cos(\omega_2 k) + P_3 \cos(\omega_3 k) \quad (16)$$

where power calculation for the signal y(n) is $$P_i = 0.5(A_i^2 + B_i^2) \quad (17)$$

for i=1,2, and 3, and they represent the average power at the frequencies $$\omega_i = 1,2,3 \quad (18)$$

The third-order cumulant sequence $c_y(k,l)$ of y(n) of (12) is given by $$c_y(k,l) = 0.25 A_1 A_2 A_3 G_1(\omega_1, \omega_2, k, l) \quad (19)$$

and $$G_1(\omega_1, \omega_2, k, l) = \cos(\omega_1 k + \omega_2 l) + \cos(\omega_1 l + \omega_2 k) + \quad (20)$$
$$\cos(\omega_1 k - \omega_3 l) + \cos(\omega_2 k - \omega_3 l) +$$
$$\cos(\omega_3 k - \omega_1 l) + \cos(\omega_3 k - \omega_2 l).$$

The fraction of the power at $$\omega_3$$

due to quadratic phase coupling, is equal to $$0.25\, A_1 A_2 A_3, \quad (21)$$

This power can be recovered from c(0,0) as $$Q = c(0,0)/G_1(\omega_1, \omega_2, 0, 0) \quad (22)$$

where $G_1$ is defined as in equation (20).

Example 2

Another signal y(n) may be represented by $$y(n) = A_1 \cos(\omega n + v) + A_2 \cos(2\omega n + 2v) + B \cos(2\omega n + v). \quad (23)$$

This is a special case of the last example, where $$\omega_1 = \omega_2 = \omega. \quad (24)$$

Similar to the above example, the fraction of power at frequency of $2\omega$ due to quadratic phase coupling is $$Q = A_1^2 A_2/4 = c(0,0)/G_2(\omega, 0, 0) \quad (25)$$

where $$G_2(\omega, 0, 0) = 0.5 G_1(\omega, \omega, k, l) \quad (26)$$

and $G_1$ is given as in equation (20).

IV. MEASURING ALGORITHMS

A. Harmonic Components

The autocorrelation functions of the multiplexed tested signals are computed for the evaluation of the harmonic components. Let the signal waveforms be expressed as $$y(n) = \sum_{m=0}^{N-1} Y_m \cos(mn\omega T + u_m). \quad (27)$$

The autocorrelation sequence of y(n) is $$r_y(k) = \sum_{m=0}^{N-1} 0.5 Y_m^2 \cos(m\omega kT) \quad (28)$$

N values of $r_y(k)$ are used to build a system of linear equations.

The simultaneous solution of the system of linear equations will give the harmonic components.

B. Methods for Evaluation of the Frequencies of Harmonic Components Pisarenko Harmonic Decomposition Method The Pisarenko harmonic decomposition method provides a means for determining unknown frequency of the harmonic components of a signal. Autocorrelation may then be used to determine harmonic components of the test signal. For N-1 randomly-phased sinusoids with power $P_i$ in additive white noise with a noise variance $\sigma_W^2$ and for a unit sampling period, the autocorrelations are as follows:

$$R_y(0) = \sigma_w^2 + \sum_{i=1}^{N-1} P_i \quad (29)$$

$$R_y(k) = \sum_{i=1}^{N-1} P_i \cos(2\pi f_i k), k \neq 0 \quad (30)$$

where $P_i = A_i^2/2$ is the average power in the $i^{th}$ sinusoid and $A_i$ is the corresponding amplitude of the signal. Hence we may write (30)

$$\begin{bmatrix} \cos 2\pi f_1 & \cos 2\pi f_2 & \ldots & \cos 2\pi f_p \\ \cos 4\pi f_1 & \cos 4\pi f_2 & \ldots & \cos 4\pi f_p \\ \cdot & \cdot & & \cdot \\ \cdot & \cdot & & \cdot \\ \cdot & \cdot & & \cdot \\ \cos 2\pi p f_1 & \cos 2\pi p f_2 & \ldots & \cos 2\pi p f_p \end{bmatrix} \begin{bmatrix} P_1 \\ P_2 \\ \cdot \\ \cdot \\ \cdot \\ P_{N-1} \end{bmatrix} = \quad (31)$$

$$\begin{bmatrix} R_y(1) \\ R_y(2) \\ \cdot \\ \cdot \\ \cdot \\ R_y(N-1) \end{bmatrix}$$

If we know the frequencies $f_i$, $1 < i < N-1$, we may use this equation to determine the powers of the sinusoids. Once the powers are known, the noise variance can be obtained from (29) as $$\sigma_w^2 = R_y(0) - \sum_{i=1}^{N-1} P_i \tag{32}$$

In general, a signal consisting of N-1 sinusoidal components satisfies the difference equation $$x(n) = -\sum_{m=1}^{2(N-1)} a_m x(n-m) \tag{33}$$

and corresponds to the system with the system function $$H(z) = 1 / \left( 1 + \sum_{m=1}^{2(N-1)} a_m z^{-m} \right) \tag{34}$$

The polynomial $$A(z) = 1 + \sum_{m=1}^{2(N-1)} a_m z^{-m} \tag{35}$$

has 2(N-1) roots on the unit circle which correspond to the frequencies of the sinusoids.

Now suppose that the sinusoids are corrupted by a white noise sequence w(n) with $$E[|w(n)|^2] = \sigma_w^2 \tag{36}$$

Then we observe that $$y(n) = x(n) + w(n) \tag{37}$$

The problem that remains is to determine the N-1 frequencies $f_i$, $1 < i < N-1$, which in turn, require knowledge of the eigenvector a corresponding to the eigenvalue $$\sigma_w^2. \tag{38}$$

Pisarenko observed that for an autoregressive moving average (ARMA) process consisting of N-1 sinusoids in additive white noise, the variance of the noise corresponds to the minimum eigenvalue of the autocorrelation matrix when the dimension of the autocorrelation matrix equals or exceeds $(2(N-1)+1) \times (2(N-1)+1)$. The frequencies $f_i$, $1 < i < N-1$ are obtained from the roots of the polynomial in (35), where the coefficients are the elements of the eigenvector a corresponding to the minimum eigenvalue given by the variance of the additive white noise. Additional details of this technique may be found in J. G. Proakis and D. G. Manolakis, "*Digital Signal Processing: Principles, Algorithms, and Applications,* Second Edition, Macmillan Publishing Company, New York, 1992, hereby incorporated by reference.

Music Algorithm

Another method for finding the frequency of the harmonic components of a signal is multiple signal classification (MUSIC). The MUSIC method is also a noise subspace frequency estimator. To describe the method, first consider the "weighted" spectral estimate $$P(f) = \sum_{k=N}^{M} w_k |s^H(f) v_k|^2 \tag{39}$$

where $\{v_k, k=N, \ldots, M\}$ are the eigenvectors in the noise subspace, $\{w_k\}$ are a set of positive weights, and s(f) is the complex sinusoidal vector $$s(f) = [1, e^{j2\pi f}, e^{j4\pi f}, \ldots, e^{j2\pi(M-1)f}] \tag{40}$$

H denotes the conjugate transpose in (39). $\sigma_w^2 I$ is the autocorrelation matrix for the noise and of rank M.

Note that at $f = f_i$, $s(f_i) \equiv s_i$, so that at any one of the N-1 sinusoidal frequency components of the signal $$P(f_i) = 0, \quad i = 1, 2, \ldots, N-1 \tag{41}$$

Hence, the reciprocal of P(f) is a sharply peaked function of frequency and provides a method for estimating the frequencies of the sinusoidal components. Thus $$1/P(f) = 1 / \left[ \sum_{k=N}^{M} w_k |s^H(f) v_k|^2 \right] \tag{42}$$

Although theoretically 1/P(f) is infinite where $f = f_i$, in practice the estimation errors result in finite values for 1/P(f) at all frequencies. Hence $$P_{MUSIC}(f) = 1 / \left[ \sum_{k=N}^{M} |s^H(f) v_k|^2 \right] \tag{43}$$

The estimate of the sinusoidal frequencies are the peaks of $P_{MUSIC}(f)$. Once the sinusoidal frequencies are estimated, the power of each of the sinusoids may be obtained by solving equation (31). Further discussion of this procedure may be found in J. G. Proakis and D. G. Manolakis, *Digital Signal Processing: Principles, Algorithms, and Applications,* Second Edition, Macmillan Publishing Company, New York, 1992, which is hereby incorporated by reference.

C) PHASE SHIFTS OF THE HARMONIC COMPONENTS a) Sinusoidal voltage and distorted current:
Let $$v(n) = V_o + V\cos(nT\omega) \tag{44}$$

and $$i(n) = \sum_{k=0}^{N-1} I_k \cos(knT\omega + v_k) \tag{45}$$

where
$V_o$ is the DC component of v(n), $I_o$ is the DC component of $i(n)$,
$I_1$ is the fundamental frequency component of $i(n)$, and
$I_k, k=2 \ldots N-1$ is harmonic components of the current $i(n)$.

First, the harmonic components of voltage and current are calculated as described in IV (A).

The DC components of voltage ($V_o$) and current ($I_o$) are then filtered out to get the time dependent values of the voltage and the current.

$$v_o(n) = V\cos(nT\omega) \tag{46}$$

$$i_o(n) = \sum_{k=1}^{N-1} I_k \cos(knT\omega + v_k) \tag{47}$$

A signal $y(n)$ is then generated from $$v_o(n)i_o(n) + i_o(n)V_e + \sum_{k=1}^{N-1} V_e I_k \cos(knT\omega) \tag{48}$$

where $V_e$ is the effective value of $v_o(t)$, e.g. $V_e$ equals 0.707 $V(t)$. From this definition given by (48), then $$y(n) = \sum_{k=1}^{N-1} [V_e I_k \cos(knT\omega) + V_e I_k \cos(knT\omega + v_k) + \sqrt{2}\, V_e I_k \cos(k\omega nT) \cos(k\omega nT + v_k)]. \tag{49}$$

Vector diagram representation of the first two terms in the above equation helps in replacing them by a single term then it follows $$y(n) = \sum_{k=1}^{N-1} (A_k \cos(k\omega nT + 0.5v_k) + 0.5B_k(\cos v_k + \cos(2k\omega nT + v_k)), \tag{50}$$

where, $$A_k = \sqrt{2}\, V_e I_k \sin(0.5 v_k), \tag{51}$$

and $$B_k = \sqrt{2}\, V_e I_k. \tag{52}$$

The calculation of the terms $A_k$ and $B_k$ will help in the calculation of the phase shifts of the harmonic components.

The phase shift between the corresponding harmonic components of the voltage and current waveform may be calculated also as follows:

The third-order cumulant sequence $c_y(k,l)$ of $y(n)$ is given by $$c_y(k,l) = \sum_{m=1}^{N-1} Q_m G_2(m\omega, k, l), \tag{53}$$

where, $$Q_m = 0.25 A_m^2 B_m \tag{54}$$

and, $$G_2(m\omega, k, l) = \cos(m\omega(k+1)) + \cos(m\omega(k-2l)) + \cos(m\omega(2k-l)). \tag{55}$$

From a sequence of $c_y(k,k)$ for a length $N-1$, it follows:

$$G_2(m\omega, k, k) = \cos(2m\omega k). \tag{56}$$

This sequence generates a system of $N-1$ linear equations with $Q_m$, $m=1,2,\ldots,N-1$ as unknowns. The phase shift of each voltage harmonic component is calculated from $$\sin^2(0.5 v_m) = Q_m/(16 V_e^3 I_h^3) \tag{57}$$

If the voltages and currents are both nonsinusoidal, the phase shifts of the harmonic components may be calculated as follows. First, filter the voltage waveform from all harmonics, DC component except for the fundamental voltage component as shown in equation 46. Second, calculate the phase shifts of the current components as given in equation 57. Finally, the phase shifts of the current components are calculated with respect to another voltage harmonic component.

The result will help in finding the phase shift of the voltage harmonic component with respect to the fundamental voltage component by subtracting the resulting phase shifts of each harmonic component from the corresponding result obtained from the second step.

D. ACTIVE AND REACTIVE POWER i) Systems with sinusoidal voltage and nonsinusoidal current For a system with voltage $v_o(n)$ and current $i_o(n)$, the instantaneous power is $v_o(n)i_o(n)$ and the active power is the product of the fundamental values of voltage, current and cosine of the angle between the fundamental components of voltage and current. The harmonic components are calculated for the current and the fundamental component of voltage from the calculation of a set of autocorrelation functions for the current and voltage waveforms. A new signal is formed as the sum of the product of multiplying the current waveform with the effective value of the voltage plus the product of the effective value of the voltage with the sum of the harmonic components of the current plus a weighed product of the voltage and the current. This resulting waveform has the character of phase quadrature between its elements. The phase shift between the harmonic components follow the same procedures described in the examples and as given above in equations 46–57. Algorithms for the active power, reactive power, and apparent power can be established for the calculated harmonic components and the phase shift between the harmonic components of the signals representing the current and the voltage as will be described in Section E below.

ii) Systems with nonsinusoidal voltages and currents

The harmonic components of the voltage and current waveforms are obtained from the calculation of a set of autocorrelations functions for each of the current and voltage waveforms. A new signal is formed from the sum of the product of the current waveform with chosen harmonic components of voltage plus the product of the voltage waveform with the same order of harmonic component of the current plus a weighed product of the voltage and current waveforms. This new signal has quadrature phase coupling for the chosen harmonic component and the calculation of the phase shifts at that harmonic order follows the same procedure mentioned above in equations 46–57. The process is repeated for another harmonic order until all the phase shifts between harmonic components can be measured. Algorithms for active power, reactive power, and apparent power are established based on the knowledge of the harmonic components and the phase shifts between harmonic components as will be shown in Section E.

D) TOTAL HARMONIC DISTORTION

The total harmonic distortion is given by the effective value of all the harmonic components other than the fundamental and DC component then dividing the result by the effective value of the fundamental.

E) ACTIVE, REACTIVE, AND APPARENT POWER CALCULATIONS

Figure 13:
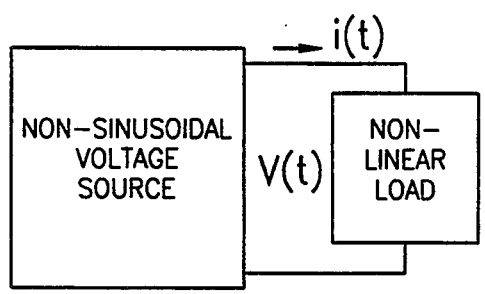
FIG. 13 is a block diagram showing application of a nonsinusoidal voltage to a non-linear load.

If a periodic load voltage v(t) of angular frequency w and rms value V (which possesses harmonics of $k_1 w$ frequency with $k_1$ from a set $K_1$), and harmonic rms values $V(k_1)$ is applied to a nonlinear load, the resulting source current i(t) of rms value I possesses harmonics of $k_2 w$ frequency, with $k_2$ from a set $K_2$ and harmonic rms values $I(k_2)$ (FIG. 13).

In this case, the signals v(t) and i(t) may be represented by $$v(t) = \sum_{k_1} \sqrt{2}\, V(k_1)\sin(k_1 wt - \alpha_{k1}),$$

where $k_1 \quad K_1 = N - 1 \cup L$ and $$i(t) = \sum_{k_2} \sqrt{2}\, I(k_2)\sin(k_2 wt - \beta_{k2}), \qquad (58)$$

where $k_2 \quad K_2 = N - 1 \cup M, \quad k_1, k_2 \quad N - 1 \cup K.$

Both sets $K_1$ and $K_2$ can be included in the set of indexes k as a subset of K. We consider that the harmonics' rms values, denoted in common by F(k), satisfy $$F(k)/F(k)_{max} > \delta \qquad (59)$$

where $\delta$ is an arbitrary small number. The rms values of v(t) and i(t) can be expressed as $$V^2 = \sum_{k \ N-1 \cup L} V^2(k) \qquad (60)$$

$$I^2 = \sum_{k \ N-1 \cup M} I^2(k) \qquad (61)$$

where N-1 is the set of indexes present in both the voltage and current, and L and M are sets of indexes present only in the voltage or current, respectively. Then, according to their indexes in the harmonics spectrum, the rms values can be split into $$V^2 = V_{N-1}^2 + V_L^2 \qquad (62)$$

$$I^2 = I_{N-1}^2 + I_M^2 \qquad (63)$$

where $$V_{N-1}^2 = \sum_{K \ N-1} V^2(k); \quad V_L^2 = \sum_{K \ L} V^2(k) \qquad (64)$$

$$I_{N-1}^2 = \sum_{K \ N-1} I^2(k); \quad I_M^2 = \sum_{K \ M} I^2(k) \qquad (65)$$

which permits expressing the apparent power, $$S = VI, \qquad (66)$$

as $$S^2 = S_{N-1}^2 + S_M^2, \qquad (67)$$

where $$S_{N-1} = VI_{N-1}, \qquad (68)$$

and $$S_M = VI_M. \qquad (69)$$

This illustrates the existence of two different apparent powers related to hypothetical currents $i_{N-1}$ and $i_M$ flowing in the linear and nonlinear load branches of the load equivalent circuit. $S_{N-1}$ can be split, in turn, into two other components as $$S_{N-1}^2 = V^2 \sum_{K \ N-1} I^2(k)(\cos^2\phi_k + \sin^2\phi_k). \qquad (70)$$

The mathematical equation identifies the active power harmonics $$P(k) = V(k)I(k)\cos\Psi_k \qquad (71)$$

and reactive power harmonics $$Q(k) = V(k)I(k)\sin\Psi_k, \text{ where } k \epsilon N-1, \qquad (72)$$

involved in the power transmission between the supply terminals and a linear load ($\phi_K$=load impedance phase angle). Thus it is convenient to express (70) as $$S_{N-1}^2 = V^2 \left( \sum_K P(k)^2/V(k)^2 + Q(k)^2/V(k)^2 \right) \qquad (73)$$

identifying the resistive and reactive power components $$S_r^2 = V^2 \sum_K P(k)^2/V(k)^2 \qquad (74)$$

and $$S_x^2 = V^2 \sum_K Q(k)^2/V(k)^2, \quad k \quad N-1. \qquad (75)$$

It can be demonstrated that the resistive power component $S_r$ contains the active power $$P = \sum_{K \ N-1} P(k) \qquad (76)$$

and a residual term $S_s$, which are mutually orthogonal. So, (74) can be written in the form $$S_r^2 = P^2 + S_s^2 \qquad (77)$$

-continued where $$S_s^2 = V^2\left[\sum_K P(k)^2/V(k)^2 - P^2/V^2\right] \quad (78)$$

and coincides, for linear loads, with the apparent power components.

The terms $P(k)/V(k)^2$ and $P/V^2$ are the harmonic load conductance and the equivalent load conductance, respectively. We can summarize the above analysis of the apparent power by writing the expressions $$S^2 = S_{N-1}^2 + S_M^2 \quad (79)$$
$$= S_r^2 + S_x^2 + S_M^2 \quad (80)$$
$$= P^2 + S_s^2 + S_x^2 + S_M^2 \quad (81)$$

Measurements in the time and frequency domains
Measurements in the time Domain

The effective values for voltage and current are V and I. The active power is P. Mathematical expressions for these variables are given by:

$$V^2 = (1/((N-1)T))\sum_{n=1}^{N-1} v(n)^2 \quad (82)$$

$$I^2 = (1/((N-1)T))\sum_{n=1}^{N-1} i(n)^2 \quad (83)$$

$$P = 1/((N-1)T)\sum_{n=1}^{N-1} v(n)i(n) \quad (84)$$

where v(n) and i(n) are simultaneous samples of v(t) and i(t) taken at equal intervals over a time period (N-1)T, where the sampling period T and (N-1) is a convenient number of samples which give an accurate result.
Measurement in the frequency domain The harmonic components of the voltage and the current are V(k) and I(k) respectively with the index k as a subset of M; let the current and voltage waveforms x(n) be identified with the sinecosine coefficients of a series with the form $$x(n) = \tfrac{1}{2}a(0) + \sum_{k=0}^{(m/2)-1}[a(k)\cos(2\pi nk/m) + b(k)\sin(2\pi nk/m)] + \tfrac{1}{2}(-1)^n a(m/2) \quad (85)$$

where;

$$a(k) = 2\,\mathrm{Re}\,X(k) \text{ for } 0 < k < m/2, \quad (86)$$

and $$b(k) = -2\,\mathrm{Im}\,X(k) \text{ for } 0 < k < m/2. \quad (87)$$

The active power terms P(k) and the reactive power terms for harmonic frequency index k as a subset of M are defined respectively by:

$$P(k) = 2[ReV(k)ReI(k) + ImV(k)ImI(k)] \quad (88)$$

and $$Q(k) = 2[ReV(k)ImI(k) - ImV(k)ReI(k)] \quad (89)$$

for harmonic frequencies of index $k = 1 \to N - 1$.

F. Impedance Measurement in Distorted Waveforms

The harmonic load conductances and susceptances, respectively, may then be calculated as $$G(k) = P(k)/V(k)^2 \quad (90)$$

$$B(k) = Q(k)/V(k)^2 \quad (91)$$

The harmonic load impedance is $1/[G(k)+jB(k)]$ and harmonic currents $$I_r(k)^2 = P(k)G(k) \quad (92)$$

$$I_x(k)^2 = Q(k)B(k) \quad (93)$$

are calculated to accumulate their respective total resistive and reactive currents and then multiplied by the rms voltage to get the active and reactive components of the apparent power. The component $S_s$ is obtained indirectly from $S_r$ and P; $S_s^2 = S_r^2 - P^2$. Finally, the apparent power component of $S_M$, due to the load nonlinearity, can be obtained after identifying the $I_{rms}$ spectrum to get $I_M$ as defined in (65), and multiply by V as obtained from (62). Further details of this procedure may be found in J. C. Montano Asquerino, M. Castilla Ibanez, A. Lopez Ojeda, and J. Gutierrez Benitez, *Measurement of Apparent Power in the Frequency Domain*, IEEE Transactions on Instrumentation and Measurement, Vol. 39, 1990, pp. 583–587, hereby incorporated by reference.

G) IMPLEMENTATION EXAMPLES OF THE INVENTION

The following calculation examples are provided to show the implementation of the present inventions techniques. These two examples are only for showing some of the many situations in which the invention may be applied.

In the first example, the two signals $y_1(n)$ and $y_2(n)$ embedded in noises $n_1(n)$ and $n_2(n)$ respectively are assumed to be $$y_1(n) = A_o + A_1 \cos(\omega_1 nT + \gamma_1) + n_1(nT); \quad (94)$$

and $$y_2(n) = B_o + B_1 \cos(\omega_1 nT + \Psi_1) + B_2 \cos(\omega_2 nT + \Psi_2) + n_2(nT). \quad (95)$$

These signals therefore represent the situation where one signal $y_1(n)$ contains only the DC and fundamental frequencies and where the second signal $y_2(n)$ is distorted (i.e. containing DC and all harmonics). The autocorrelation function for the signal $y_1(n)$ (for a unit sampling period) is $$r_{y1}(k) = A_o^2 + 0.5A_1^2 \cos^2(\omega_1 k) \quad (96)$$

The autocorrelation function for the signal $y_2(n)$ is $$r_{y2}(k) = B_o^2 + 0.5B_1^2 \cos^2(\omega_1 k) + 0.5B^2 \cos^2(\omega_2 k) \quad (97)$$

Two values $r_{y1}(1)$ and $r_{y1}(2)$ are calculated from the definition of autocorrelation function given in (5). From (96) it follows:

$$r_{y1}(1) = A_o^2 + 0.5 A_1^2 \cos^2(\omega_1) \tag{98}$$

and $$r_{y1}(2) = A_o^2 + 0.5 A_1^2 \cos^2(2\omega_1) \tag{99}$$

The values of $A_o^2$ and $A_1^2$ are obtained from simultaneous solution of the above two linear equations in these unknowns. Three values for $r_{y2}(k)$ for $k=1,2$, and 3 are calculated from the definition of autocorrelation function in (5). From (97) it follows:

$$r_{y2}(1) = B_o^2 + 0.5 B_1^2 \cos^2(\omega_1) + 0.5 B_2^2 \cos^2(\omega_2) \tag{100}$$

$$r_{y2}(2) = B_o^2 + 0.5 B_1^2 \cos^2(2\omega_1) + 0.5 B_2^2 \cos^2(2\omega_2) \tag{101}$$

$$r_{y2}(3) = B_o^2 + 0.5 B_1^2 \cos^2(3\omega_1) + 0.5 B_2^2 \cos^2(3\omega_2) \tag{102}$$

Simultaneous solution of the above three equations in the unknowns $B_o^2$, $B_1^2$, and $B_2^2$ is performed to find the parameters of (95).

The DC components of the signals $y_1$ and $y_2$ are then filtered to get $$y'_1(n) = A_1 \cos(\omega_1 n + \gamma_1) + n_1(n) \tag{103}$$

$$y'_2(n) = B_1 \cos(\omega_1 n + \Psi_1) + B_2 \cos(\omega_2 n + \Psi_2) + n_2(n) \tag{104}$$

A signal S is formulated that has a quadrature coupling between $$\cos(\omega_1 n + \gamma_1),\ \cos(\omega_1 n + \Psi_1),\ \cos(2\omega_1 n + \Psi_1 \gamma_1). \tag{105}$$

to measure the phase shift $$\Psi_1 - \gamma_1. \tag{106}$$

This signal S is formed as $$S = y'_1 B_1 + y'_2 A_1 + 4 y'_1 y'_2 \tag{107}$$

$$= A_1 B_1 [\cos(\omega_1 n + \gamma_1) + \cos(\omega_1 n + \Psi_1) + 4 \cos(\omega_1 n + \gamma_1) \cdot \cos(\omega_1 n + \Psi_1) +] \tag{108}$$

$$= 2 A_1 B_1 [\cos((\Psi_1 - \gamma_1)/2) \cos((2\omega_1 t + \gamma_1 + \Psi_1)/2) + \cos(2\omega_1 t + \gamma_1 \Psi_1) + \cos(\Psi_1 - \gamma_1) +] \tag{109}$$

The third-order cumulant of S is $$c(0,0)/3 = (2 A_1 B_1)^3 0.25 \cos^2[0.5(\Psi_1 - \gamma_1)] \tag{110}$$

The $c(0,0)$ is calculated from the definition of the third-order cumulant in equation (9) as the average of $S^3(n)$, and so we can calculate the phase shift $$\Psi_1 - \gamma_1. \tag{111}$$

In a second example, two signals $y_1(n)$ and $y_2(n)$ embedded in noises $n_1(n)$ and $n_2(n)$ respectively are assumed to be:

$$y_1(n) = A_o + A_1 \cos(\omega_1 n + \gamma_1) + A_2 \cos(\omega_2 n + \gamma_2) + n_1(n), \tag{112}$$

and $$y_2(n) = B_o + B_1 \cos(\omega_1 n + \Psi_1) + B_2 \cos(\omega_2 n + \Psi_2) + n_2(n). \tag{113}$$

The autocorrelation function for the signal $y_1(n)$ can be expressed as $$r_{y1}(k) = A_o^2 + 0.5 A_1^2 \cos^2(\omega_1 k) + 0.5 A_2^2 \cos^2(\omega_2 k) \tag{114}$$

We use (114) for three samples of $r_{y1}(k)$ for $k=1,2,3$ to give:

$$r_{y1}(1) = A_o^2 + 0.5 A_1^2 \cos^2(\omega_1) + 0.5 A_2^2 \cos^2(\omega_2) \tag{115}$$

$$r_{y1}(2) = A_o^2 + 0.5 A_1^2 \cos^2(2\omega_1) + 0.5 A_2^2 \cos^2(2\omega_2) \tag{116}$$

$$r_{y1}(3) = A_o^2 + 0.5 A_1^2 \cos^2(3\omega_1) + 0.5 A_2^2 \cos^2(3\omega_2). \tag{117}$$

The lefthand side for the above three equations is evaluated from the definition of the autocorrelation function in equation (5) as $$r_{y1}(k) = 1/(N) \sum_{n=0}^{n} y_1(n) y_1((n+k)) \tag{118}$$

The parameters $A_o$, $A_1$, and $A_2$ are calculated from solving simultaneous system of equations of (115), (116), and (117).

The autocorrelation function for the signal $y_2$ is given by $$r_{y2}(k) = B_o^2 + 0.5 B_1^2 \cos^2(\omega_1 k) + 0.5 B_2^2 \cos^2(\omega_2 k) \tag{119}$$

In similar way, three samples for the $r_{y2}(k)$, $k=1,2,3$ are calculated from the definition of autocorrelation function and is substituted in the left hand side of the above equation to form a system of three simultaneous linear equations in the unknowns $B_o$, $B_1$, and $B_2$. The solution of the linear system of equations gives the unknowns $B_o$, $B_1$, and $B_2$.

The DC component of $y_1(n)$, and $y_2(n)$ are filtered out to get $$y'_1(n) = A_1 \cos(\omega_1 n + \gamma_1) + A_2 \cos(\omega_2 n + \gamma_2) + n_1(n); \tag{120}$$

$$y'_2(n) = B_1 \cos(\omega_1 n + \Psi_1) + B_2 \cos(\omega_2 n + \Psi_2) + n_2(n). \tag{121}$$

We formulate a signal $S_1$ that has quadrature coupling between the terms $$\cos(\omega_1 n + \gamma_1),\ \cos(\omega_1 n + \Psi_1),\ \cos(2\omega_1 n + \gamma_1 + \Psi_1) \tag{122}$$

to measure the phase shift $$\Psi_1 - \gamma_1. \tag{123}$$

The signal $S_1(n)$ is formed as $$S_1(n) = B_1 y'_1(n) + A_1 y'_2(n) + 4 y'_1(n) y'_2(n) \tag{124}$$

and proceed as in the first example.

We formulate a signal $S_2(n)$ that it has quadrature coupling between the terms $$\cos(\omega_2 n + \gamma_2),\ \cos(\omega_2 n + \Psi_2),\ \cos(2\omega_2 n + \gamma_2 + \Psi_2) \tag{125}$$

to calculate the phase shift $$\Psi_2 - \gamma_2. \tag{126}$$

The signal $S_2(n)$ is given by $$S_2(n) = B_2 y'_1(n) + A_2 y'_2(n) + 4 y'_1(n) y'_2(n) \tag{127}$$

and proceed as mentioned in the last example.

V. DESCRIPTION OF THE HARDWARE

Figure 2:
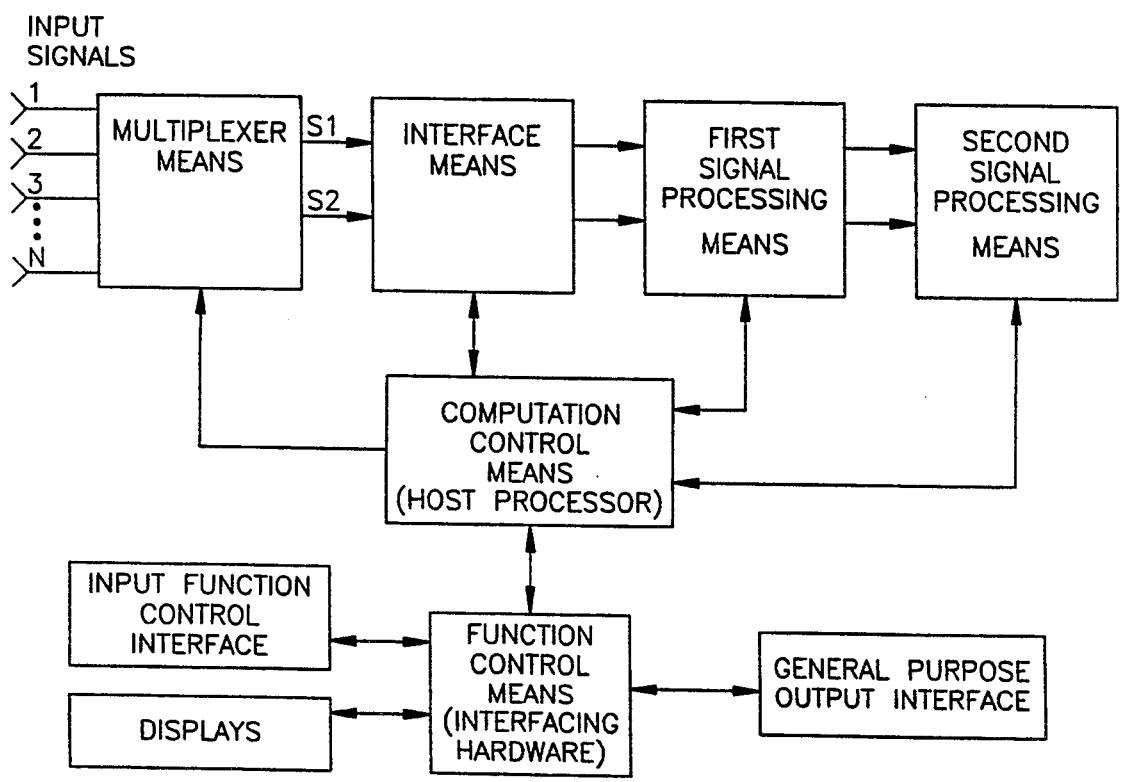
FIG. 2 shows the main blocks of realizing the concept of the signal instrument synthesizer and the digital multimeter.
Figure 3:
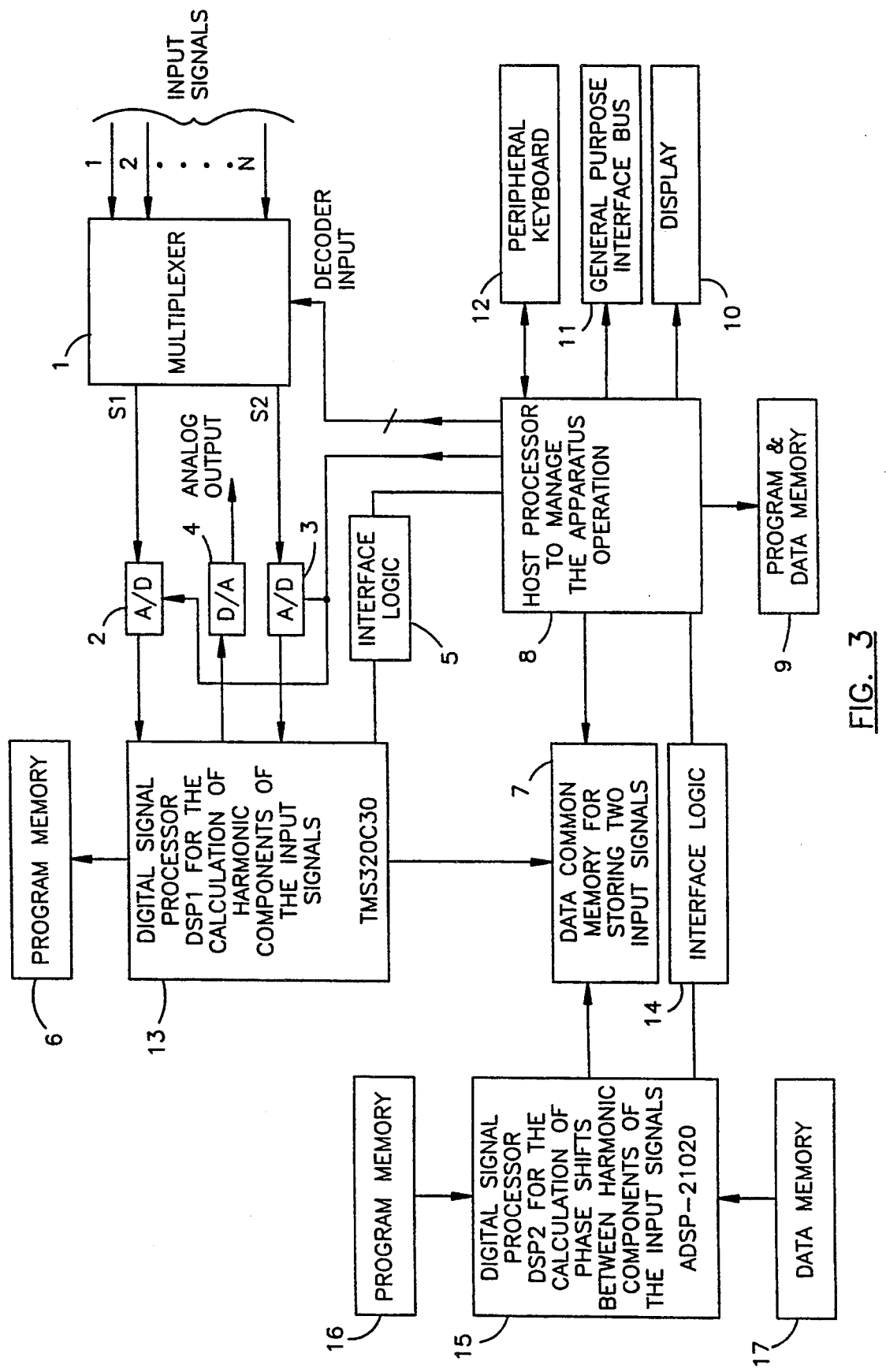
FIG. 3 is a block diagram of the signal synthesizer and the digital multimeter.

The overall hardware implementation of the invention is best shown in FIGS. 2 and 3. As can be seen in the figures, the Digital Signal Processors 13, 15 and host processor 8 are the heart of the system. When the Digital Signal Processer (DSP) 13, 15 and host processor 8 are paired together, they provide a low-cost, high performance DSP system ideally suited for adaptive DSP task requiring battery back-up. The host processor 8 is the master chip and the DSPs 13, 15 work in the slave mode. In the preferred embodiment, the first DSP 13 is a TMS320C30 from Texas Instruments and the second DSP 15 is an ADSP-21020 of Analog Devices, but could be any of numerous compatible substitutes. As is well understood in the art, the symbol "⇤" in the figures is used to represent a plurality of signal lines.

DSPs have several external hardware interrupts, internally generated interrupts, and software interrupts. For the external user interrupts and the internal timer interrupts, DSPs automatically stack the arithmetic status and mode registers in parallel while servicing the interrupt, allowing multi-nesting levels of very fast service for these interrupts.

The programmable interval timer provides periodic interrupt generation, when enabled, and the timer decrements a count register every cycle. When this count register reaches zero, the DSP generates an interrupt and asserts its output. The count register is automatically reloaded from a period register and the count resumes immediately.

The external memory interface supports memory-mapped peripherals and slower memory with a user-defined combination of programmable wait states and hardware acknowledge signals. Both program memory and data memory addressing support page mode addressing of static column dynamic random access memory (DRAMs).

The internal components of DSP are supported by four internal buses: program memory address (PMA), data memory address (DMA), program memory data (PMD), and data memory data (DMD). The program memory address (PMA) and data memory address (DMA) buses are used for the addresses associated with program and data memory. The program memory data (PMD) and data memory data (DMD) buses are used for the data associated with the memory spaces. These buses are extended off chip. The data memory select (DMS) and program memory select (PMS) signals select data memory and program memory, respectively.

External devices can gain control of memory buses from DSP with bus request/ grant signals ($\overline{BR}$ and $\overline{BG}$). To relinquish its buses in response to a bus request, the DSP halts internal operations and places its program and data memory interfaces in a high-impedance state. In addition, data memory and program memory three-state controls ($\overline{DMTS}$ and $\overline{PMTS}$) allow an external device to place either program or data memory interface in a high-impedance state without affecting the other interfaces and without halting the DSP unless it requires a program memory access.

The following two signals coordinate the operation of the DSP and other devices in the system.

(1) The CLKIN signal comes from a clock oscillator that provides clocking for the DSP and other devices operating synchronously with it.

(2) The $\overline{RESET}$ signal is provided by a circuit that resets all or part of the system.

The basic DSP configuration features are program memory, data memory and peripherals that are mapped into data memory space. The connections in each memory interface are:

(1) Address buses for program memory and data memory (PMA and DMA)
(2) Data buses for program memory and data memory (PMD and DMD)
(3) Bank selects for program memory and data memory ($\overline{PMS}$ and $\overline{DMS}$)
(4) Read signals for program memory and data memory ($\overline{PMRD}$ and $\overline{DMRD}$)
(5) Write signals for program memory and data memory ($\overline{PMWR}$ and $\overline{DMWR}$)

FIG. 3 shows the general block diagram of the apparatus. Signals 1,2, ... , N are connected to the multiplexer 1. The peripheral keyboard 12 is used to choose which signals are to be processed. The host processor 8 controls the decoder input to the multiplexer 1 which connects the required signals denoted by $S_1$, $S_2$ as shown at output of the multiplexer 1. The output signals $S_1$ and $S_2$ are digitized using analog-to-digital converters 2 and 3, then fed to DSP1 13 to be stored in the data common memory 7. Both converters 2 and 3 are triggered from the host processor 8 as determined by the sampling rate and the trigger point for starting conversion. DSP1 13 is used to calculate harmonic components and DSP2 15 is used to calculate the phase shifts of the harmonic components of $S_1$ and $S_2$. DSP1 13 is connected to its program and data memory 6 and 7. The host processor 8 is connected to its program and data memory 9 as well as the common data memory 7. DSP2 15 is connected to its program and data memory 16 and 17. Interface logic 5 allows parallel processing of DSP1 13 and host processor 8. Interface logic 14 allows parallel processing of DSP2 15 and host processor 8. The operation of the apparatus is controlled by the peripheral keyboard 12. The results are displayed by Display 10 or communicated to other digital link using the general purpose interface bus GPIB 11

Figure 4:
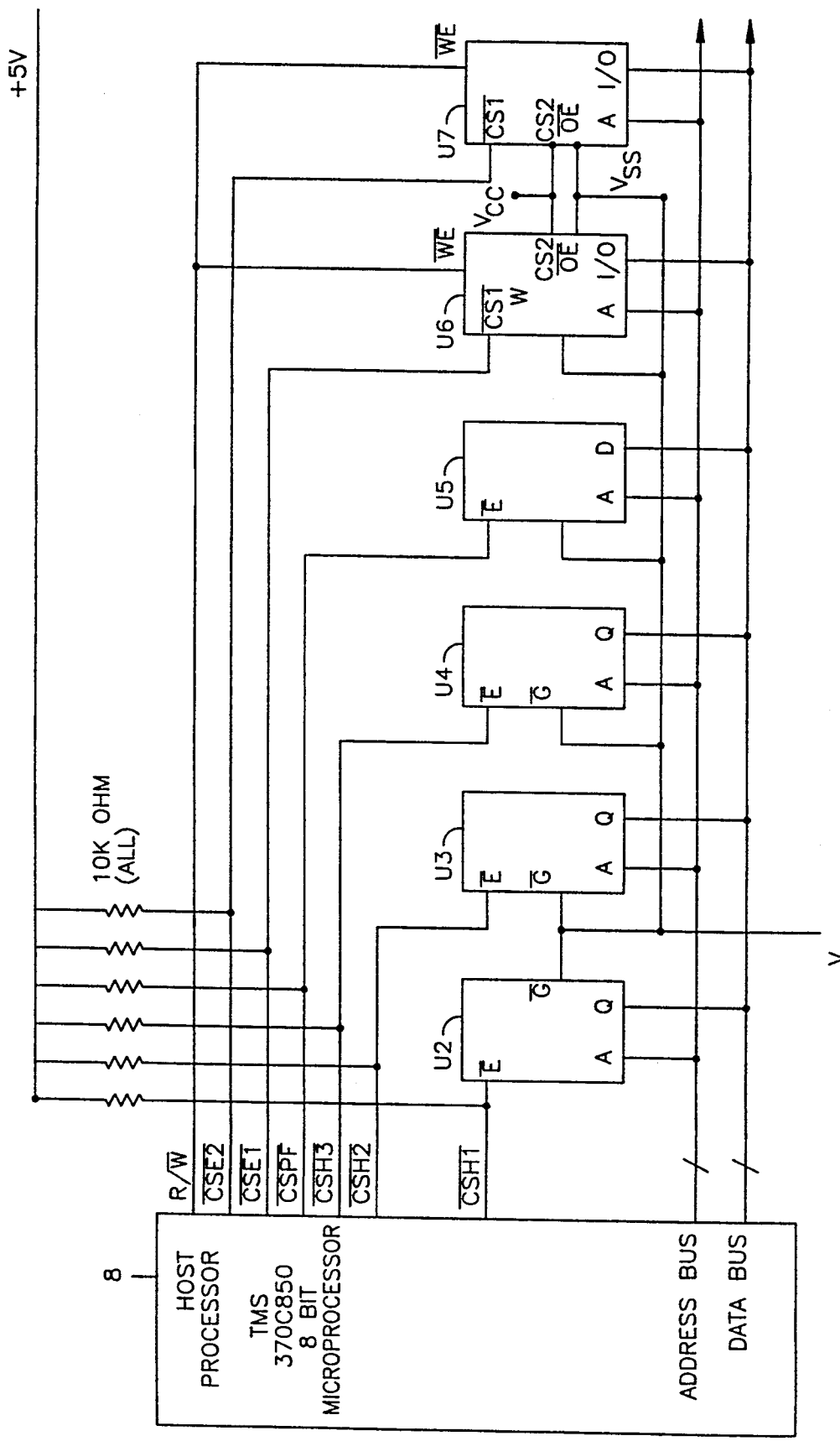
FIG. 4 shows the host processor and its interface circuitry to different program and data memory.

FIG. 4 shows a method of interfacing the host processor with different types of external memory. The goals of the design are to interface with the maximum amount of memory, to use the least expensive logic elements, to use a minimum amount of parts, and maintain sufficient system speed. The host processor 8 is used with EPROMs U2, U3, U4 to provide 96K bytes of EPROM and RAM ICs U6, U7 to give 16K of RAM. In the preferred embodiment, U2, U3, and U4 are TMS27C256, 32K×8 EPROMS, and U6 and U7 are each HM6264LP 8K×8 static RAM. Peripheral devices U5 using up to 64 bytes of memory may also interface to the host processor bus. U5 represents such a 64 byte peripheral. This gives a total memory of 116K; 112K of external memory and 4K memory internal to the microcomputer. The chip select signal are $\overline{CSxx}$ must be used with external memory to validate the memory cycle. R/$\overline{W}$ is the read/write signal of the host processor 8. A and Q are the address bus and data bus of U2, U3, and U4. $\overline{E}$ is the enable signals for U2, U3, and U4, U5. $\overline{G}$ is the ground voltage level $V_{ss}$ for U2, U3, and U4. $\overline{OE}$ means output enable, and $\overline{CS}$ is chip select in this Figure. I/O means data bus of U7.

Figure 5A:
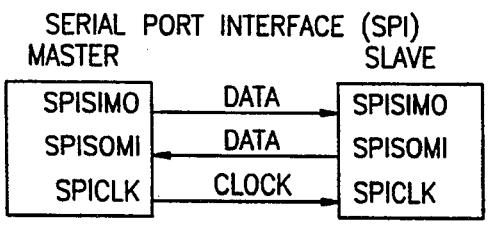
FIG. 5a shows master/slave communication between serial port interfaces of the host processor and the display drivers, block 10 of FIG. 3, or between the general purpose interface bus (GPIB), block 11 of FIG. 3.

FIG. 5a shows Master/Slave operation of serial port interface (SPI) 11. SI characters are used to mean slave input, SO, slave output; MI, master input; MO, master output; and CLK means clock. The SPI port of the host processor 8 provides synchronous communication of the host processor 8 and the peripherals such as display drivers and other host processor synchronous transmission. The transmission is supported by programmable parameters such as character length and bit transfer rate. Data is transmitted until the clock signal stops.

Figure 5B:
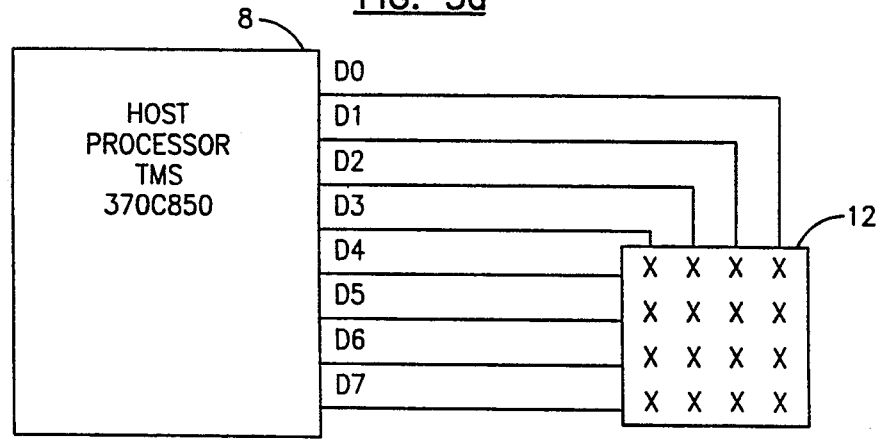
FIG. 5b shows a keyboard scanning circuit, block 12 of FIG. 3, interfaced to the data bus of the host processor.

FIG. 5b shows how the host processor e scans a keyboard 12. A software driven interrupt activated by pushing a button reads the keyboard and returns the hex digit of the key depressed and debounces the key to avoid noise. A valid key flag is set when a new key is found, notifying the host 8 that a new key is to be read.

Figure 6:
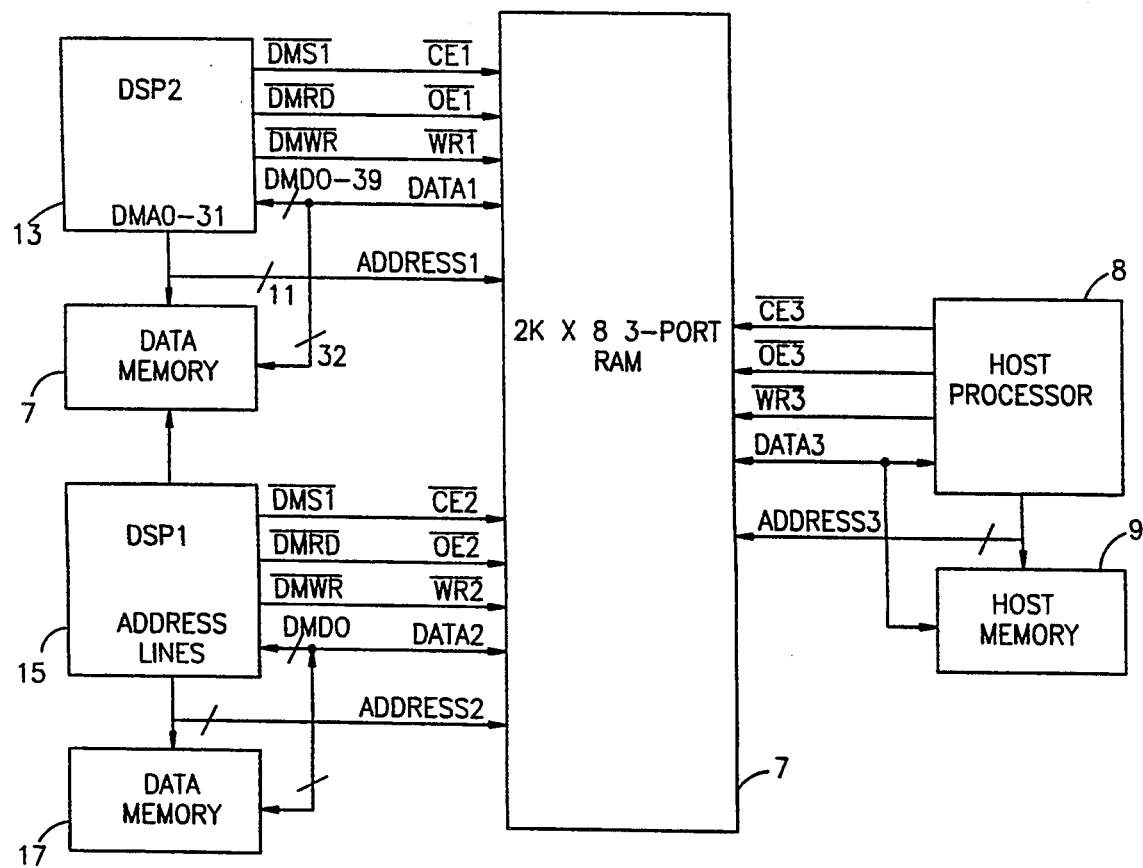
FIG. 6 shows memory interface circuitry and how a common memory area, block 7 of FIG. 3, is accessed by the host processor, block 8 of FIG. 3, and the two digital signal processors DSP1 and DSP2 (blocks 13 and 15 of FIG. 3, respectively).

FIG. 6 shows the interface between DSPs 13 and 15, host processor 8, and 4-port RAM 7. Each processor maps access to this memory to bank 1 of data memory select enabled by $\overline{\text{DMS1}}$ from DSP1 or $\overline{\text{CE3}}$ of host processor 8. If the memory is 2k size then only 11 address lines are needed to access the memory. Local memory on each processor occupies a different bank by different memory select signals. $\overline{\text{DMRD}}$ means data memory read, $\overline{\text{DMWR}}$ means data memory write. DMD 0–39 means 40 line data memory data bus. DMA means address bus of data memory. $\overline{\text{CE}}$ means chip enable and $\overline{\text{OE}}$ means output enable. For DSP1 15 the on-chip Direct Memory Access controller can read from or write to any location in the memory map without interfering with DSP1 operation. Block 7 is the data memory of DSP2, 17 is the data memory of 15. Block 9 is the memory of 8.

Figure 7:
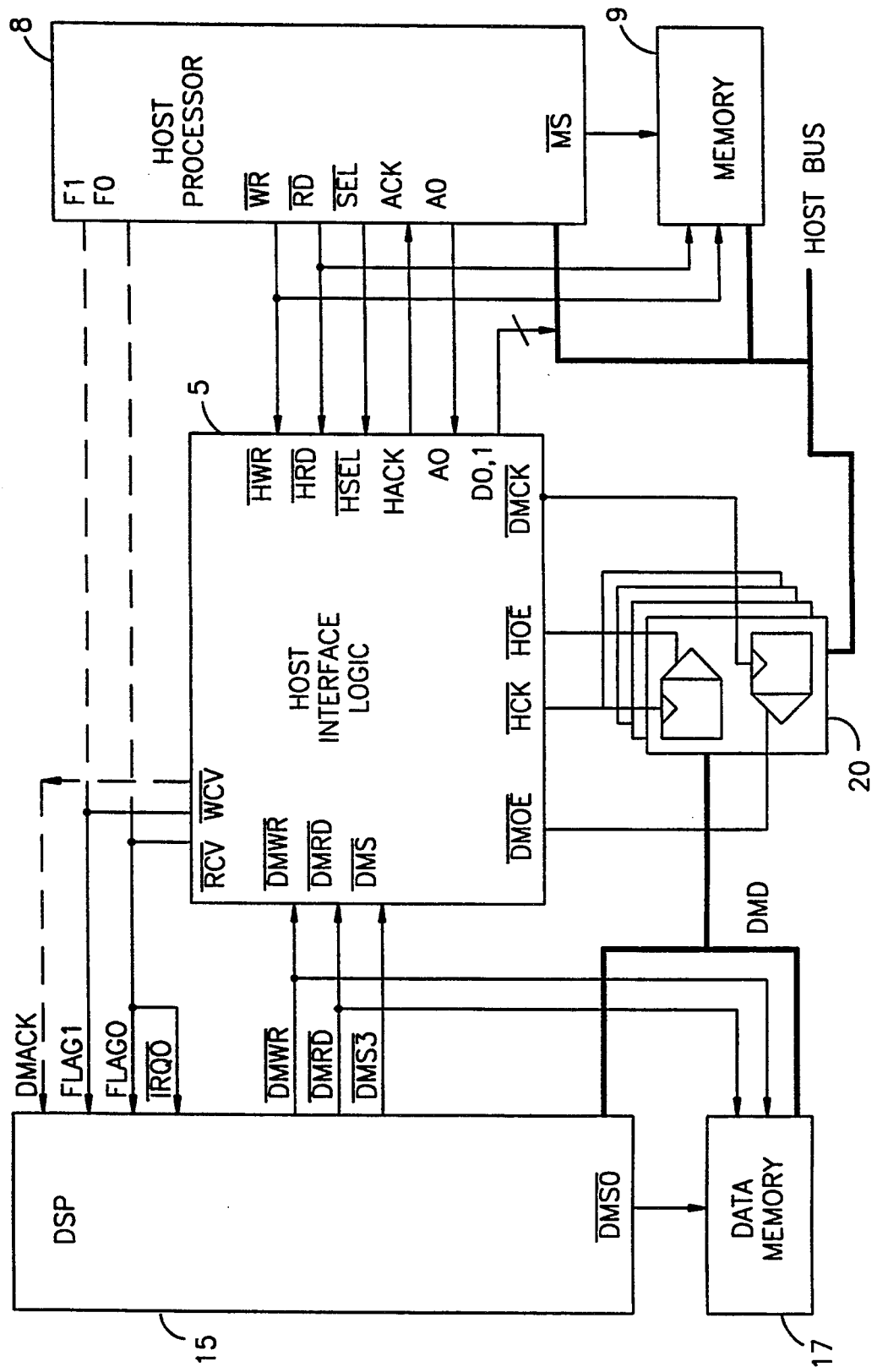
FIG. 7 shows the interface circuit between the host processor, block 8 of FIG. 3, and one of the two digital signal processors, DSP1 (block 13 of FIG. 3).

FIG. 7 shows the host port block diagram. Described in this figure is a bidirectional interface 14 between DSP 15 and a host microprocessor 8. The interface 14 consists of three channels: the write channel, the read channel, and the status channel. The write channel transfers data from the host 8 to the DSP 15. The read channel transfers data from the DSP 15 to the host 8. The status channel provides the host 8 with information regarding the state of the read and write channels. Octal edge triggered registers 20 also control data communication with the host interface logic 14.

The details of the interface logic are well understood in the art as follows. When the host 8 writes data to the port, the write channel valid flag ($\overline{\text{WCV}}$) goes active. This flag informs the DSP that valid data is present in the write channel. Similarly, when the DSP 15 writes data to the port, the read channel valid flag ($\overline{\text{RCV}}$) goes active. Both flags are cleared when their respective channels are read. It is the channel valid flags that the host processor 8 accesses when it reads the status channel. The channel valid flags are set and cleared on the rising edge of the strobes. This ensures that the flags reflect the true state of the channels at all times if the host is slower than the DSP 15.

Host processor 8 transfers Data to DSP 15 ADSP-21020 of Analog Devices as follows:
(1) The host processor writes data to the port. The $\overline{\text{WCV}}$ flag is set on the rising edge of the host write strobe.
(2) The DSP samples the $\overline{\text{WCV}}$ flag, either by polling or interrupt.
(3) The ADSP-21020 reads the port, clearing the $\overline{\text{WCV}}$ flag.

Because the $\overline{\text{WCV}}$ flag is cleared by the DSP read cycle before the host begins its write, the $\overline{\text{HACK}}$ line is asserted immediately after the host processor write strobe is asserted, ending the host processor cycle without wait states. If the host processor attempts to write the port again before the DSP reads it, the $\overline{\text{HACK}}$ line is deasserted immediately after the write strobe is asserted and remains deasserted until the ADSP-21020 reads the data. The $\overline{\text{HACK}}$ line is then asserted, ending the host processor cycle. The previous host processor data is not corrupted by the second host processor write because the data is clocked in on the rising edge of the write strobe. The host processor can avoid hanging up by reading the status bits before each transfer.

DSP transfers data to host processor as follows:
(1) The DSP writes data to the port, setting the $\overline{\text{RCV}}$ flag on the rising edge of the write strobe.
(2) The host processor samples the $\overline{\text{RCV}}$ flag, either by being interrupted, or by reading the status channel.
(3) The host processor reads the port, clearing the $\overline{\text{RCV}}$ flag on the rising edge of the read strobe.

Because the $\overline{\text{RCV}}$ flag is set by the DSP write before the host processor begins its read, the $\overline{\text{HACK}}$ line is asserted immediately after the host processor read strobe is asserted, ending the host processor cycle without wait states. If the host processor attempts to read the port before new data has arrived, the $\overline{\text{HACK}}$ line is deasserted immediately after the host processor read strobe is asserted until the DSP writes data to the port. Then the $\overline{\text{HACK}}$ line is asserted ending the host processor cycle.

Since this is an asynchronous interface, the status of the channels may change even as the host processor is reading the status. At worst, this could cause the host processor to wait longer than necessary before initiating the next access.

Similar host processor interface logic circuit can be designed to interface DSP1 to the host processor.

Analog-to-digital (A/D) and digital-to-analog (D/A) converters are components that are commonly required in DSP systems and interface efficiently to the I/O expansion bus. These devices are available in many speed ranges and with a variety of features, and while some may be used at full speed on the I/O bus, others may require one or more wait states. The interfacing of A/D and D/A converters to DSPs is well known in the art.

Figure 8:
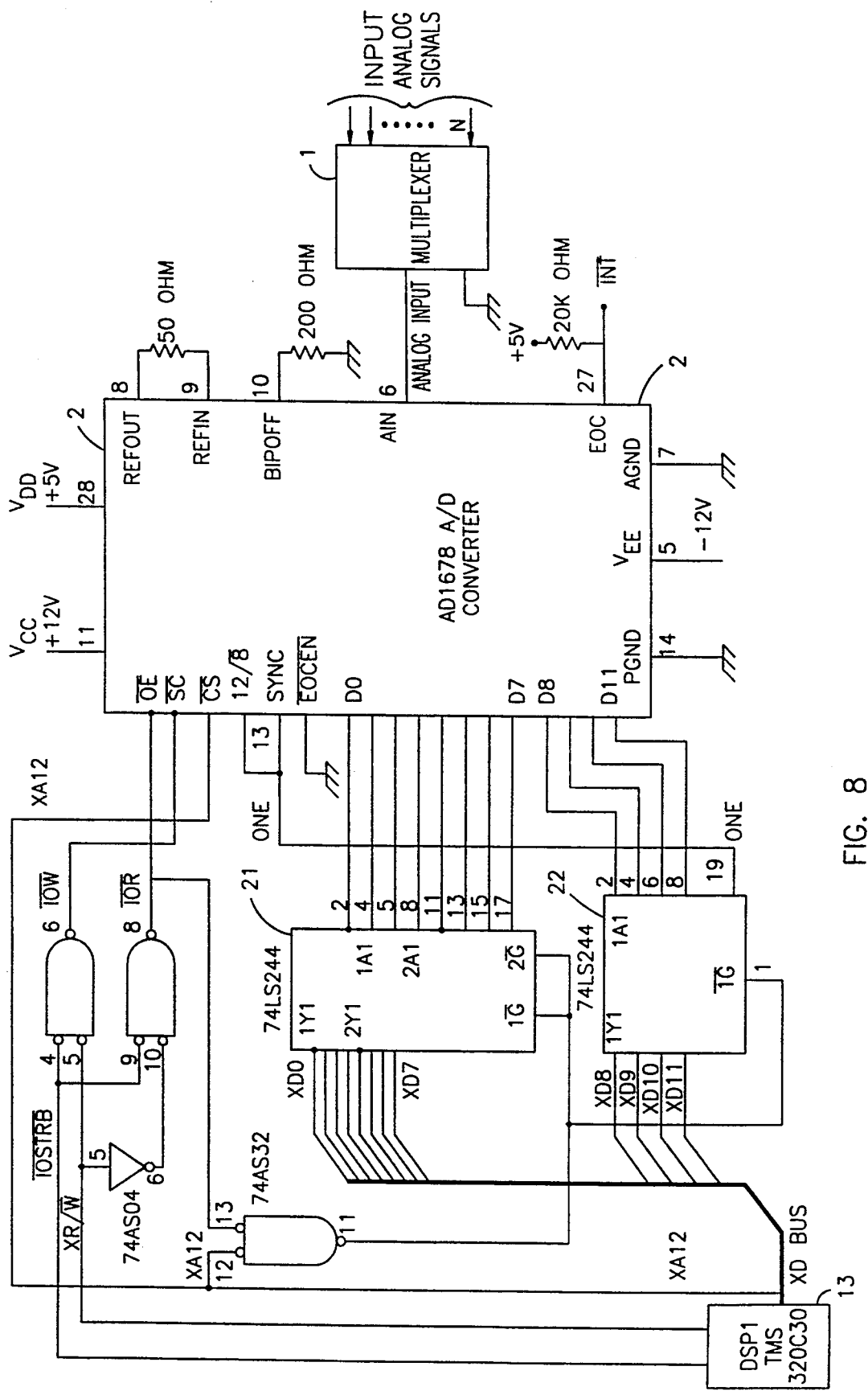
FIG. 8 shows the input interface means as an example of the A/D converter and the expansion bus interface of the digital signal processor.

FIG. 8 shows the interfacing of the Analog Devices AD1678 Analog-Digital (A/D), converter 2, to the DSP 13. The AD1678 is very flexible converter and is configurable in a number of different operating modes. These operating modes include byte or word data format, continuous or non-continuous conversions, enabled or disabled chip select function, and programmable end of conversion indication. This interface utilizes 12-bit word data format, rather than byte format to be compatible with the floating point digital signal processor TMS320C30 of Texas Instruments (as an example for the first processor 13). Non-continuous conversions are selected, so that variable sample rates may be used, since continuous conversions occur at a rate of 200 kHz. With noncontinuous conversions, the host processor determines the conversion rate by initiating conversions through write operations to the converter.

The chip select function is enabled, so the chip select input is required to be active when accessing the device. Enabling the chip select function is necessary to allow a mechanism for the AD1678 to be isolated from other peripheral devices connected to the expansion bus. To establish the desired operating modes, the SYNC and 12/$\overline{8}$ inputs to the converter are pulled high and $\overline{\text{EOCEN}}$ is grounded, as specified in the AD1678 data sheets.

In this application, the converter's chip select is driven by the address signal XA12 on the expansion data bus of DSP1, which maps this device at 804000h in I/O address space. Conversions are initiated by writing any data value to the device and the conversion results are obtained by reading from the device after the conversion is completed. To generate the device Start Conversion ($\overline{SC}$) and output enable ($\overline{OE}$) inputs, $\overline{IOSTRB}$ inputs, is ANDed with XR/$\overline{W}$. Therefore, the converter is selected whenever XA12 is low, and $\overline{OE}$ is driven when reads are performed, while SC is driven when writes are performed.

As with many A/D converters, at the end of a read cycle the AD1678 data output lines enter a high impedance state. This occurs after the Output Enable ($\overline{OE}$) or read control line goes inactive. Also common with these types of devices, is that the data output buffers often require a substantial amount of time to actually attain a full high-impedance state. When used with the DSP1 13, the converters must have their outputs fully disabled no later than 65 ns following the rising edge of the $\overline{IOSTRB}$, since the DSP1 13 will begin driving the data bus at this point if the next cycle is a write. If this timing is not met, bus conflicts between the DSP1 13 and the AD1678 2 may occur, potentially causing degraded system performance and even failure due to damaged data bus drivers. The actual disable time for the AD1678 can be as long as 80 ns, therefore buffers 21, 22 are required to isolate the converter outputs from the TMS320C30 13. The buffers used here are 74LS244 that are enabled when the AD1678 2 is read, and turned off 30.8 ns following $\overline{IOSTRB}$ going high. Therefore, the DSP1 13 requirement of 65 ns is met.

When data is read following a conversion, the AD1678 takes 100 ns after its $\overline{OE}$ control line is asserted to provide valid data at its outputs. Thus, including the propagation delay of 74LS244 buffers 21, 22, the total access time for reading the converter is 118 ns. This requires two wait states on the TMS320C30 13 expansion I/O bus.

Figure 11:
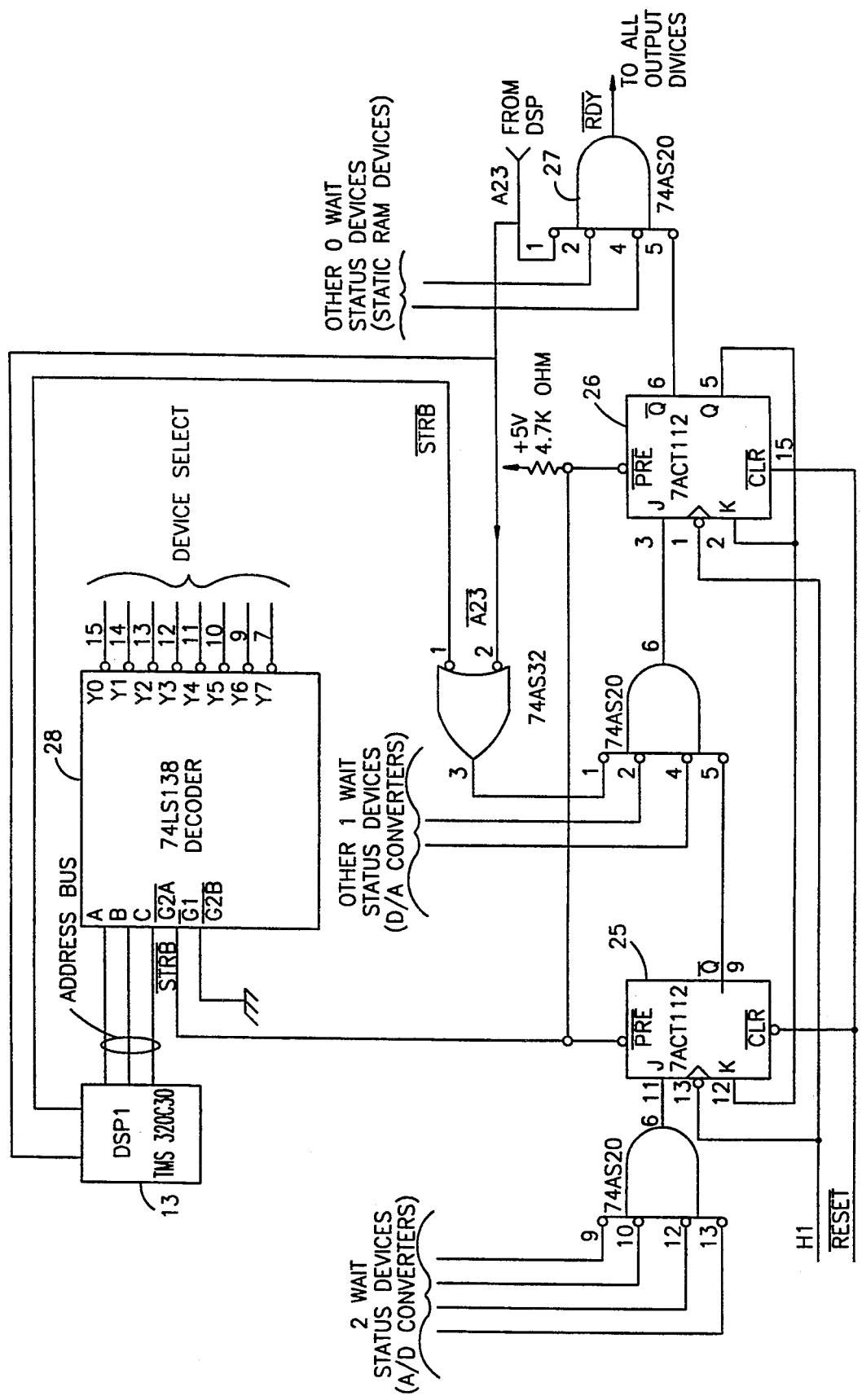
FIG. 11 shows the generation of ready signals for different wait devices connected to the digital signal processor.

The two wait states required in this case are implemented using software states, however, depending on the overall system configuration, it may be necessary to implement a separate wait state generator for the expansion bus. This would be the case if there were multiple devices that required different numbers of wait states connected to the expansion bus as shown in FIG. 11.

Although the preferred analog-to-digital converter is the AD1678, it should be noted that for different applications, use of TLC1225 or TCL1550 A/D converters from Texas Instruments may be beneficial. The TLC1225 is a self-calibrating 12 bit-plus-sign bipolar or unipolar converter which features 10 μs conversion time. The TLC1550 is a 10-bit, 6 μs converter with a high speed DSP interface. Both converters are parallel-interface devices.

In many DSP systems, the requirement for generating an analog output signal is a natural consequence of sampling an analog waveform with an A/D converter and then processing the signal digitally internally. Interfacing D/A converters to the TMS320C30 on the expansion I/O bus is also quite straightforward and is well known in the art.

As with A/D converters, D/A converters are also available in a number of varieties. One of the major distinctions between various types of D/A converters is whether or not the converter includes latches to store the digital value to be converted to an analog quantity, and the interface to control those latches. With latches and control logic included with the converter, interface design is often simplified, however, interval latches are often included only in slower D/A converters.

Because slower digital-to-analog converters limit signal bandwidths, the converter chosen for this design was selected to allow a reasonably wide range of signal frequencies to be processed, in addition to illustrating the technique of interfacing to a converter using external data latches.

Figure 9:
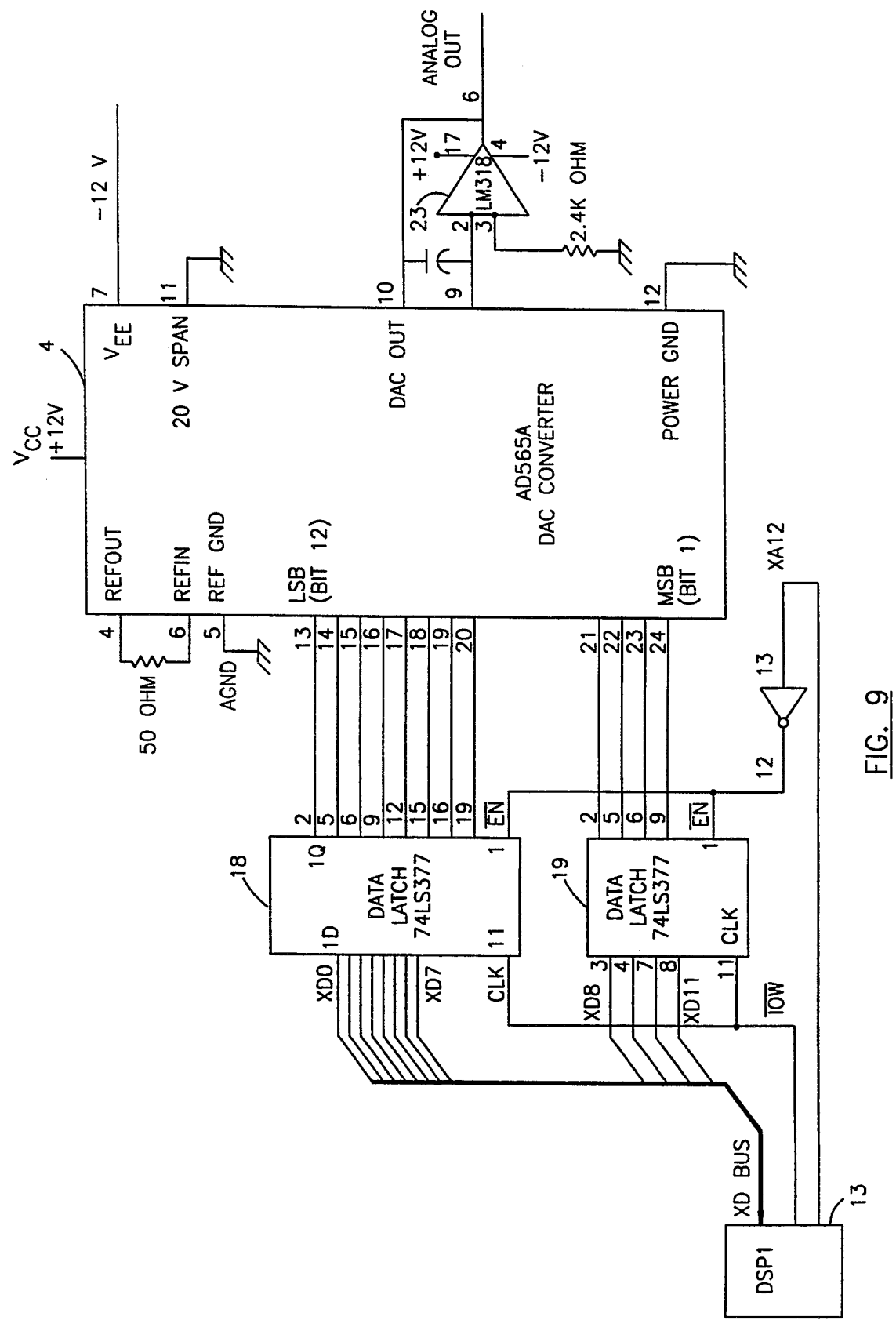
FIG. 9 shows the output interface as for an example of a D/A converter and the expansion bus interface of the digital signal processor.

FIG. 9 shows an interface of DSP1 13 (TMS320C30) to D/A converter. In the preferred embodiment, the D/A converter 4 is an Analog Devices AD565A digital-to-analog converter (D/A). This device is a 12 bit, 250 ns current output, DAC with an on-board 10 volt reference. Using an off-board, current-to-voltage conversion circuit 23 connected according to manufacturers specifications and well understood in the art, the converter exhibits output signal ranges from 0 to +10 volts. This output is compatible with the conversion range of the A/D converter discussed above.

Because this DAC essentially performs continuous conversions based on the digital value provided at its inputs, periodic sampling is maintained by periodically updating the value stored in the external latches. Therefore, between sample updates, the signal value is stored and maintained at the latch outputs which provide the input to the DAC 4. This results in the analog output remaining stable until the next sample update is performed. In the preferred embodiment, the external data latches used in this interface are '74LS377' devices 18 and 19 that have both clock and enable inputs. These latches serve as a convenient interface with the TMS320C30 13. The enable inputs provide a device select function, and the clock inputs latch the data for use by the DAC. Therefore, with the enable input driven by inverted XA12 and the clock input driven by $\overline{IOW}$ from the DSP 13 which is formed is the ANDing $\overline{IOSTRB}$ with XR/$\overline{W}$, data will be stored in the latches with a write to I/O address 805000h. Reading this address has no effect on the circuit.

Because the I/O write is actually being performed to the latches, the key timing requirements are those of the output devices. For proper operation, these latches require a minimal setup and hold time of data and control signals with respect to the rising edge of the clock input. Specifically, the latches require a data setup time of 20 ns, enable setup time of 25 ns, disable setup time of 10 ns, and data and enable hold times of 5 ns. This design provides approximately 60 ns of enable setup, 30 ns of data setup, and 7.2 ns of data hold time. Therefore, the setup and hold times provided by this design are well within the requirements of the latches 18 and 19.

Figure 10:
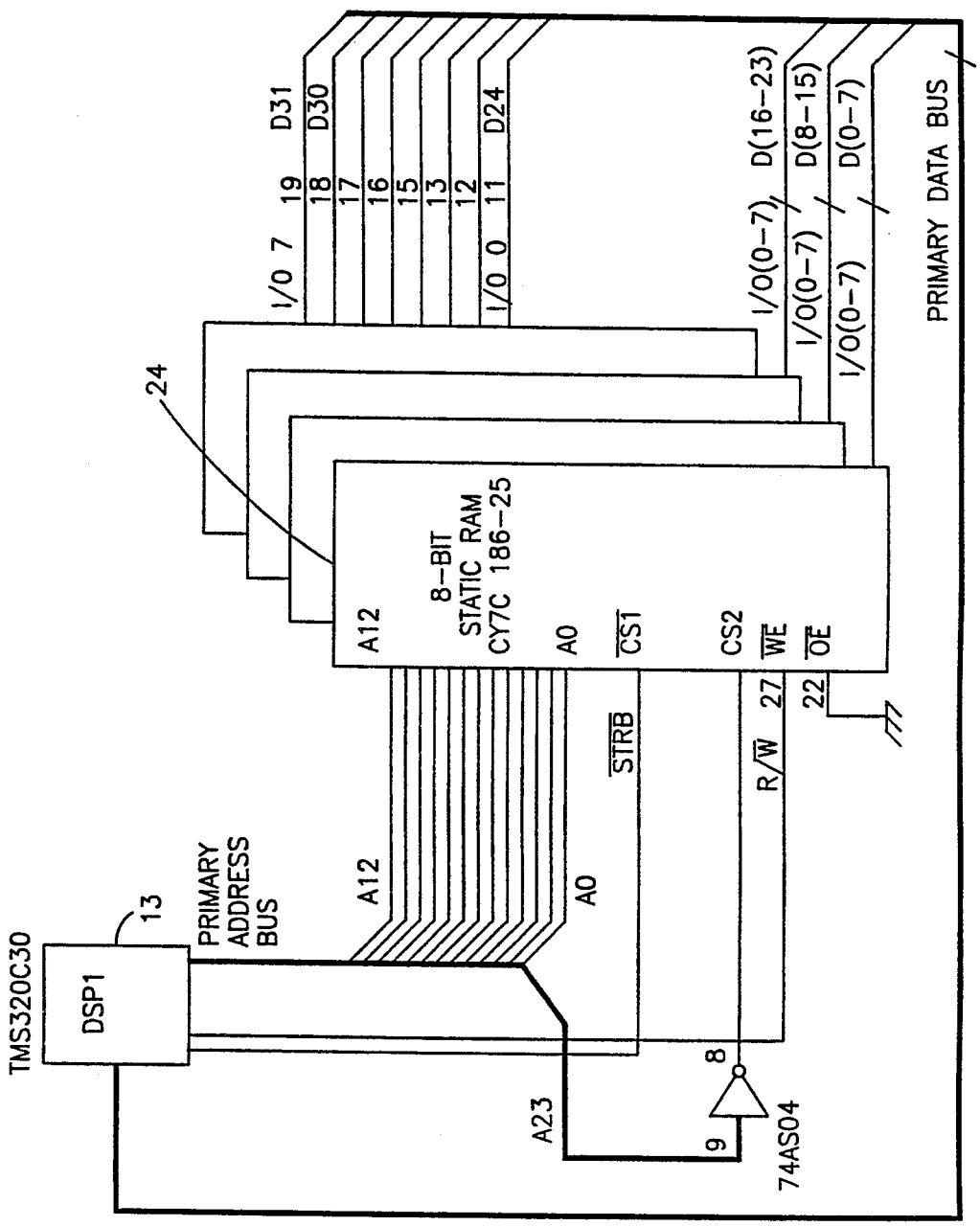
FIG. 10 shows a zero wait interface between a static RAM and the digital signal processor chip. This describes the hardware between the static random access memory chip and the primary address and data buses of the digital signal processor chip.

FIG. 10 shows a zero wait state interface between the DSP 13 and four static RAM 24 which are CYC186 CMOS RAM from Cypress Semiconductors 25 ns 8K×8-bit RAM with output enable ($\overline{OE}$) tied low and a chip select ($\overline{CS}$) is used for a controlled write cycle. The chip selects are driven by $\overline{STRB}$ and $\overline{A23}$ both from the DSP. $\overline{WE}$ control input is driven by the DSP1 13. Since chip enable ($\overline{OE}$) is not used, it is grounded. It should be noted that the CYC186's $\overline{OE}$ control is gated internally with $\overline{CS}$, therefore the RAM's outputs are not enabled unless the device is selected. RAM's without $\overline{OE}$ controls can also be easily interfaced to the TMS320C30 using a similar approach to that used with RAM with $\overline{OE}$ controls. If there is only one bank of memory implemented, and no other devices are present on the bus, the memories $\overline{CS}$ input may often be connected to $\overline{STRB}$ directly. If several devices must be selected, however, a gate is generally required to AND the device select and $\overline{STRB}$ to drive the $\overline{CS}$ input to generate the chip select controlled write cycles.

FIG. 11 shows how different devices with different wait status are served for generation ready signal RDY generation for DSP1 13. The wait states of different devices are: A/D converters 2 wait, D/A converters 1 wait, static RAM with 0 wait. In this circuit, full speed devices drive ready directly through the 74AS21 AND gate 21 and the two flip-flops 25 and 26 delay wait state devices. Select signals one or two need 41 cycles to provide 1 or 2 wait states. Decoder 28 is used in generating select signals for slower devices in the system.

FIGS. 1a, 1b, and 1c show the flow chart of digital signal processors and host processor programs. Detailed description of the algorithms of the flowcharts are given in the theory of operation and examples given in Section IV. The software is stored on a PROM connected to the DSPs or the host processor.

VI. Examples of Applications of the Invention

The following are presented as merely a few of the vast number of applications of merely the present invention to the processing of signals. It will be apparent to those skilled in the art that the techniques and benefits of the present invention may be implemented in almost any situation involving the transmission of information by electromagnetic radiation.

A. Amplitude Modulation (AM) Transmission

Amplitude modulation is one of the oldest forms of modulation. A carrier signal is assumed to be a sinusoid and the message signal g(t) is considered to have a zero DC component. Consequently, no carrier component appears in the output.

A modulated carrier may be represented $$e(t) = g(t) \cos w_c t, \quad (128)$$

where the carrier frequency $w_c >> w_b$ and where g(t) is the modulating signal and the signal has frequency $W_b$. This modulation process is commonly called double-sideband suppressed carrier (DSBSC) or simply double sideband (DSB). The spectral components of the DSB signal e(t) are given by its Fourier transform, $$E(jw) = 0.5 \, G[j(w-w_c)] + 0.5 \, G[j(w+w_c)] \quad (129)$$

Amplitude modulation may be derived from the DSB by adding a DC term to the modulating signal g(t), e(t) then becomes $$e(t) = [1 + g(t)] \cos w_c t. \quad (130)$$

It is to be noted that the RF modulated signal is in phase with the modulation signal, similar to the case of DSB, the only difference being the addition of the DC term. In order to derive the frequency spectrum of an AM signal, the last equation is rewritten as $$e(t) = [1 + m_a g(t)] \cos w_c t \quad (131)$$

where the factor $m_a$ is known as the "modulation index," "modulation factor," or degree of modulation. The percentage modulation is then given by $100 m_a$. A basic assumption is made that the modulating signal g(t) varies slowly compared with the carrier and that the absolute value of $m_a g(t) < 1$ to ensure an undistorted envelope. We shall presently consider a type of modulating signals.

Assume the modulating signal is band-limited with no DC component, $$g(t) = \sum_{n=-M}^{M} C_n e^{jnwt} = 2 \sum_{n=1}^{M} |C_n| \cos(nwt + \theta_n) \quad (132)$$

where $w = 2\pi/T$, T is the period of the modulation, and $Mw << w_c$. The output signal e(t) becomes $$e(t) = \cos(w_c t) + \quad (133)$$

$$m_a \sum_{n=1}^{M} |C_n| [[\cos[(w_c + nw)t + \theta_n] + \cos[(w_c - nw)t - \theta_n]]$$

If we analyze e(t) using autocorrelation functions we can evaluate $C_n$ for $n=1$ to M. In the same way we can analyze the signal e(t) to get $m_a$ the modulation factor. Additional information may be found in Philip F. Panter, *Modulation, Noise, and Spectral Analysis: Applied to Information Transmission*, McGraw-Hill Book Company, New York, 1965, hereby incorporated by reference.

B. Linear Demodulation or Detection

Figure 12:
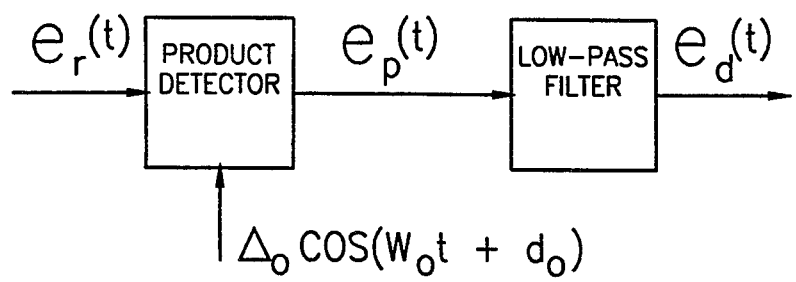
FIG. 12 is a block diagram of a double-sideband (DSB) reciever.

The process of separating a modulating signal from a modulated carrier is called demodulation or detection. In DSB reception the incoming signal $e_r(t)$ is multiplied by a locally generated signal which is phase-synchronized with the carrier component of the received signal $e_r(t)$. A basic DSB receiver is shown in FIG. 12.

The multiplication process is accomplished in practice by using what is commonly known as a product detector or demodulator. If the linearly modulated received carrier is given by $$e_r(t) = A_c g(t) \cos(\omega_c t + \Psi_c) \quad (134)$$

and the locally generated oscillation is denoted by $$e_o(t) = A_o \cos(\omega_o t + \Phi_o) \quad (135)$$

The output of the product demodulator is then given by $$e_p(t) = A_o A_c g(t) \cos(\omega_c t + \Phi_c) \cos(\Phi_o t + \Phi_o) = 0.5 A_o A_c g(t)[[\cos(\omega_c - \omega_o)t + \Phi_c - \Phi_o] + [\cos((\omega_c + \omega_o)t + \Phi_c + \Phi_o)]] \quad (136)$$

Assuming that the local oscillator is properly synchronized with the transmitted carrier, the last equation (136) is simplified to $$e_p(t) = 0.5 A_o A_c [g(t) + g(t) \cos(2\omega_c t + 2\Phi_c)] \quad (137)$$

If the original signal g(t) is given by $$g(t) = \sum_{i=1}^{M} A_i \cos \omega_i t \quad (138)$$

then $$e_p(t) = 0.5A_oA_c\left[\sum_{i=1}^{M} A_i\cos(\omega_i t) + \left(\sum_{i=1}^{M} A_i\cos\omega t\right)\cos(2\omega_c t + 2\phi_c)\right] \quad (139)$$

$$= 0.5A_oA_c\left[\left(\sum_{i=1}^{M} A_i\cos\omega_i t\right) + 0.5\left(\sum_{i=1}^{M} A_i\cos(2\omega_c t + \omega t + 2\phi_c) + \left(\sum_{i=1}^{M} A_i\cos(2\omega_c t - \omega t + 2\phi_c)\right)\right]\right]$$

Normally the carrier frequency is much larger than the signal frequency and we can use the autocorrelation sequence to evaluate the harmonic components $A_i$ of the signal in the low frequency range of the frequency spectrum of $e_p(t)$. Additional information may be found in Philip F. Panter, *Modulation, Noise, and Spectral Analysis: Applied to Information Transmission*, McGraw-Hill Book Company, New York, 1965, hereby incorporated by reference.

C. Position, Velocity Profile Measurement of a Moving Body by Microwave Interferometry The microwave techniques currently used in telecommunications, radar, countermeasures and teledetection are related to the transmission of signals over very large distances. Microwaves are scarcely used for sensors working at distances as short as several tens of meters; these later systems, generally Doppler and frequency modulated continuous wave (FMCW) radars which are use for intruder alarms, velocimetry and level measurements, are today commercially available.

The principle of a new generation of short range sensors which can find applications in ranging and velocimetry is introduced. This process is an interferometric method, already considered for longer distances and also called differential Doppler.

Figure 14:
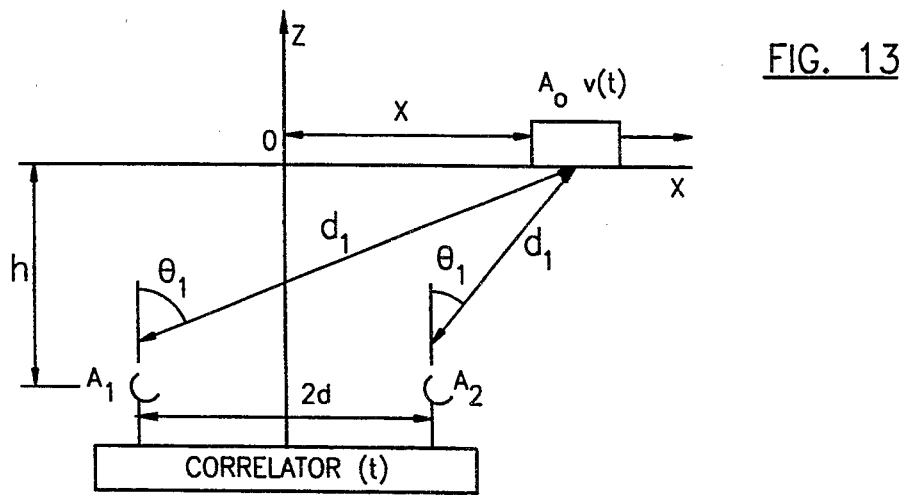
FIG. 14 shows a simplified system for the principle involved in a range finder using a microwave sensor.

A signal at frequency f, transmitted by an antenna $A_o$ located in space is received by two antennas $A_1$ and $A_2$, as shown in FIG. 14 and consequently produces two received voltages $$e_1(t) = (eG_o(\theta_1)G_1(\theta_1)/d_1)\cdot\cos(2\pi(ft - d_1/\lambda)) \quad (140)$$

and $$e_2(t) = (eG_o(\Theta_2)G_2(\theta_2)/d_2)\cdot\cos(2\pi(ft - d_2/\lambda)) \quad (141)$$

where $$G_j(\theta_j) \quad (142)$$

is the radiation pattern of antennas $A_j$ (with $i=0,1,2$, and $j=1,2$) $d_1$, $d_2$ are the distances between the transmitting and receiving antennas, $$\lambda = \text{radiation's wavelength} \quad (143)$$

and $$e = \text{real factor related to the transmitted power.} \quad (144)$$

The trajectory is on the X axis and the polarization of the antennas is chosen normal to the plane of the page. The voltages $e_1(t)$ and $e_2(t)$ depend on the relative position of the three points $A_o$, $A_1$, and $A_2$; since the positions of $A_1$ and $A_2$ are known, a convenient data processing of the voltages $e_1(t)$ and $e_2(t)$ can bring information about the position of $A_o$ and also about its displacement as a function of time.

The antennas $A_1$ and $A_2$ are connected to a correlator which provides an output signal proportional to $$\overline{e_1(t)e_2(t+\tau)} \quad (145)$$

with $\tau$, the delay time of the correlator. Assuming now that the radiation patterns have no phase shift, the output signal of the system can be written as $$S = e'B_1(d_1)B_2(d_2)\cos 2\pi((d_2-d_1)/\pi - f\tau) \quad (146)$$

where p' depends upon p and upon the gain of the receiver, and $B_i(d_i)$ is the real quantity depending only on $d_i$ and $\theta_i$ (with $i=1,2$).

We now consider the receiver array to be stationary, but the transmitter (FIG. 14) to be moving in a given direction on the X-axis. Then the output signal S, that we call interferogram, can be considered either as a function of the x coordinate (spatial interferogram) or as a function of the time t (temporal interferogram).

Figure 15:
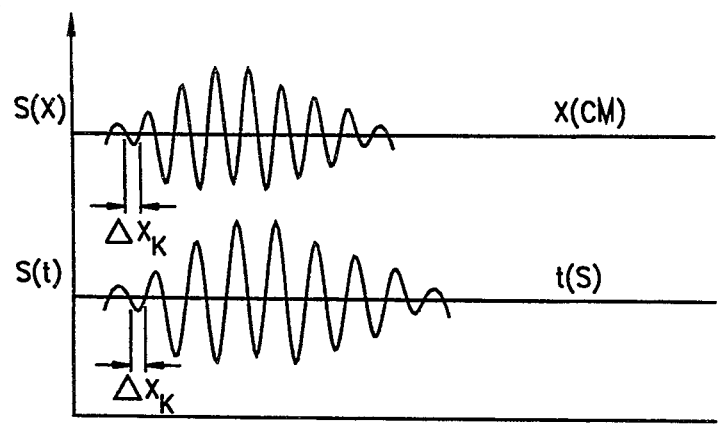
FIG. 15 is a diagram showing a spatial (x) and temporal (t) interferometer plots.

We show in FIG. 15 such a pair of interferograms for a given velocity profile of the transmitter. Clearly, to any fringe $\Delta x_k$ corresponds a fringe at $\Delta t_k$. By a fringe, we mean the portion of a spatial or temporal interferogram between adjacent zeroes. From (116) we can easily deduce the positions $x_k$ for which the output signal S is zero. For example, for $f\tau = \frac{1}{4}$, this situation occurs when $$d_2 - d_1 = k\lambda/2 \quad (147)$$

i.e., for $k = \ldots -2, -1, 0, 1, 2, \ldots$, with $k=0$ corresponding to the situation in which the transmitter and the receiver are facing each other. Then we have $S=0$ for $$x_k^2 = (0.25C_k^2)[4h^2 + 4d^2 - C_k^2]/[4d^2 - C_k^2] \quad (148)$$

where $$C_k = 0.5k\lambda \quad (149)$$

and where h is the distance to the trajectory and 2d is the distance between the receiving antennas (FIG. 15) which is also called the baseline. Note that the width of the fringe is approximately $$x_k - x_{k-1} \simeq \lambda h/4d \quad (150)$$

$$h >> (x \pm d), d >> \lambda \quad (151)$$

On one hand, the exact value is obtained as $$\Delta x_k = x_k - x_{k-1} \quad (152)$$

from (148), on the other hand $\Delta t_k$ are given by the experimental recording of the temporal interferogram.

Consequently, for every increment $\Delta x_k$ of the trajectory, it is possible to get the corresponding mean velocity of the moving body $$\overline{v_k} = \Delta x_k / \Delta t_k. \tag{153}$$

Additional information on this technique may be found in, A. Benlarbi, I. C. Van de Velde, D. Matton, and Y. Leroy, *Position, velocity profile measurement of a moving body by microwave interferometry*, IEEE Transactions on Instrumentation and Measurement, Vol. 39, 1990, pp. 632–636.

D. Digital Time-of-Flight Measurement for Ultrasonic Sensors

Another application of the present invention is with digital time-of-flight measurement for ultrasonic sensors. Ultrasonic sensors are widely used in industrial applications to measure both object distance in air and flow velocity. The operating principal is based on the measurement of the time of flight (T.o.F.), that is, the time necessary for an ultrasonic wave to travel from the transmitter to the receiver after being reflected by the target. The object distance from the transducer is $d = [c(T.o.F.)]/2$, where c is the velocity of sound.

Different techniques can be used to generate ultrasonic waves. Among them, continuous wave and pulse-echo techniques are widely known. In continuous wave methods, the transmitter generates a continuous output, whose echo is detected by a separate receiver. Accuracy depends on the measurement of phase shift between the transmitted and reflected wave. Although better performances than the pulse-echo measurements can be obtained, complex hardware is required to measure phase and, in most cases, different frequencies need to be used in order to determine the number of integer wavelengths in the phase shift.

Pulse-echo techniques are often used in commercial systems for industrial applications. With this method, a short train of waves is generated, enabling the same transducer to be used both as a transmitter and as a receiver. The simplest and most common way to detect the echo signal is the threshold method, where detection occurs when the signal crosses a given amplitude level. Although it has proved to be simple and cheap, the technique may suffer from poor resolution, particularly when the echo pulse has been greatly attenuated. An improvement consists in the adoption of an adjustable amplitude threshold, in which case detection does not depend on the magnitude of the signal but only upon its shape. In the presence of noise due to air turbulence, and/or mechanical vibrations close to the transducer operating frequency, both methods are known to achieve a repeatability of some tenths of the ultrasonic wavelength. This corresponds to different distance values, according to the transducer operating frequency and possible variations in sound velocity.

The use of digital signal processing methods in a pulse-echo measurement application is presented. The transmitted and echo pulses are transduced into electrical signals, digitized, and their cross-correlation is computed in digital form. The time index of the peak of the correlation function measures the delay between the two signals, that is, the T.o.F. The reasons for this approach are mainly twofold. First, from a conceptual point of view, signal processing algorithms can provide improved resolution and at least comparable accuracy. Second, by a measurement system based on dedicated signal hardware is at present not feasible, but also competitive in terms of cost and performance.

The transducer generates a signal, s(t), that propagates to the target and is reflected back, being detected after a delay D. The T.o.F. measurement system acquires the two digital sequences $X_T(nT)$ and $x_E(nT)$ representing the transmitted and echo signals, respectively, that can be written in the form $$x_T(nT) = s(nT) + v(nT); \tag{154}$$

and $$x_E(nT) = \alpha s(nT - D) + n(nT) \tag{155}$$

where T is the sampling interval, while the noises $v(nT)$ and $n(nT)$ take into account the discrepancies from the ideal model and can be considered as zero mean uncorrelated random processes.

The cross-correlation of the two sequences is given by $$C(kT) = \sum_{n=-\infty}^{\infty} x_T(nT) x_E(nT + kT) \tag{156}$$

According to the hypotheses given above on $v(nT)$ and $n(nT)$, the statistical expectation of this sequence is $$E[C(kT)] = \alpha C_{SS}(\tau - D)|_{\tau = kT} \tag{157}$$

Where $C_{SS}(T)$ is the autocorrelation function of the continuous signal s(t). For a finite energy signal it can be shown that $|C_{SS}(\tau)| < C_{SS}(0)$. Therefore, if $k_D$ is the index of the peak of E $[C(kT)]$, one has $D = k_D T$ when the delay is an integer multiple of the sampling interval, and $D = (k_D + \delta) T$, with $|\delta| < 0.5$, otherwise. In practice, the delay can be estimated by finding the maximum of the crosscorrelation function (156). Additional information may be found in D. Marioli, C. Narduzzi, C. Offelli, D. Petri, E. Sardini, and A. Taroni, *Digital time-of-flight measurement for ultrasonic sensors*, IEEE Transactions on Instrumentation and Measurement, 1992, vol. 41, pp. 93–97, hereby incorporated by reference.

E. Accurate Measurement of Low Signal-to-Noise Ratios Signals

Another application of the present invention is the accurate measurement of low signal-to-noise ratios using a superhetrodyne spectrum analyzer. A modern superhetrodyne spectrum analyzer measures RF power by the process of envelope detection, log amplification, and video averaging. This process is known to give an accurate power measurement for a noise-free sinusoidal tone signal, and an error of 2.5 dB for additive white Gaussian noise AWGN.

For a tone combined with AWGN, the measurements of noise power N together with the signal power S results in the need for two correction factors: one to compensate for the error in the measurement of combined signal and noise power, and another to take into account (on the logarithmic "decibel" scale) the substraction of N from (S+N)/N to get the true signal-to-noise ratio (SNR=S/N).

The method can be used for the measurement of SNR for phase-shift keyed (PSK) digital communication signals combined with AWGN. The experimental results confirmed that a narrow-band sample of a constant-envelope wide-band PSK has the same Rayleigh distribution as a narrow-band sample of AWGN. Additional information may be found in D.A. Hill and D. P. Haworth, *Accurate measurement of low signal-to-noise ratios using a superhetrodyne spectrum analyzer,* IEEE Transactions on Instrumentation and Measurement, Vol. 39, 1990, pp. 432–435, hereby incorporated by reference.

It is obvious that numerous other modifications and variations of the present invention are possible in view of the above teachings. For example, many various digital signal processors may be used to implement the algorithms. Further, many different configurations of hardware may be used to interface the individual circuit components. Finally, the algorithms may be implemented in many different software codes such as "C", Fortran, and the like.

Therefore it is to be understood that the above description is in no way intended to limit the scope of protection of the claims and is representative only of the several possible embodiments of the present invention.

There has thus been shown and described an invention which accomplishes at least all of the stated objects.

I claim:

1. A method of measuring the phase angles between any of two input test signals from a plurality of input signals having DC and harmonic components and embedded in measurement noise comprising:

providing a signal processing apparatus for determining phase angles between harmonic components of any two of the incoming test signals the apparatus having a signal processing means, multiplexer means for selectively choosing a first and second test signal from a plurality of incoming test signals, interface means electrically connected to said signal processing means and to said multiplexer means for converting said selected first and second test signals for input to said signal processing means, computation control means electrically connected to said interface means, said signal processing means and said multiplexer means for controlling the input of said first and second test signals to said signal processing means and the processing of said test signals by said signal processing means, function control means electrically connected to said computation control means for providing function control of said signal processing means and output of processed test signal data;

selecting a first and second incoming input test signal from a plurality of input test signals by said multiplexer means;

converting said first and second test signals by said interface means into converted first and second digitized test signals digitized format for processing by said signal processing means;

inputting said converted first and second digitized test signals into said signal processing means;

computing a series of N linear autocorrelation function equations for each of said first and second digitized test signals by said signal processing means, where N-1 is the number of harmonic orders;

determining DC and harmonic components of said first and second digitized test signals by simultaneously solving said N linear autocorrelation function equations;

filtering said first and second digitized test signals by removing the DC components therefrom, thereby producing first and second filtered test signals;

creating a new data set from said filtered test signals wherein said new data set has quadratic coupling between said harmonic components of said filtered test signals for a respective harmonic order;

calculating third-order cumulants of said new data set;

computing phase shift between said harmonic components using said third-order cumulants; and outputting results of signal processing of said test signals by said function control means.

2. The method of claim 1 wherein said autocorrelation function $R_y(n)$ of a data stream $y(n)$ is computed by using $$R_y(k) = E\{y(n)y(n+k)\};$$

where $R_y$ is the autocorrelation function, $y(n)$ is data sampled from said test signal at $t=nT$, and $y(n+k)$ is data sampled from said test signal at $t=(n+k)T$, and further comprising the step of calculating the crosscorrelation functions of said first and second input test signals using $$R_{xy}(k) = E\{x(n)y(n+k)\};$$

where $R_{xy}$ is the crosscorrelation function, $x(n)$ is data sampled from said first test signal at $t=nT$ and $y(n+k)$ is data sampled from said second test signal at $t=(n+k)T$, and E is the expectation operator.

3. The method of claim 2 further comprising calculating the time difference between emitted wave and echoes using crosscorrelation techniques from the inspection of the delay between first and second test signals of the peak of said crosscorrelation function between said first and second test signals.

4. The method of claim 1 further comprising the step of measuring the amplitude of said harmonic components of said test signals after identifying the harmonic frequencies using the Pisarenko Harmonic Decomposition method.

5. The method of claim 4 wherein the step of selecting a first and second signal comprises selecting at least one amplitude, frequency, or phase modulated test signal and further comprising the step of identifying the modulation modulus of said modulated test signal by analyzing the spectrum of said test signal at different frequencies.

6. The method of claim 4 further including the steps of forming a filtered waveform from said test signals by filtering out said DC component of said signal or preselected harmonic components and generating an analog signal of said filtered waveform for any of the said test signals using a D/A convertor.

7. The method of claim 1 further comprising the step of measuring the amplitude of said harmonic components after identifying the harmonic frequencies using the MUSIC method.

8. The method of claim 1 including the step of computing the total harmonic distortion of said test signals, total harmonic distortion being the ratio of the square root of the sum of the squares of all harmonic components of said test signal to the fundamental frequency component of the same test signal.

9. The method of claim 1 further comprising the step of selecting a plurality of harmonic components from said first and second test signals using said interface means and computing the effective value of said selected harmonics for said test signals, the effective value being the square root of the sum of the squares of said selected harmonics.

10. The method of claim 4 wherein the step of selecting a first and second test signal comprises selecting a first test signal representing a current signal and selecting a second test signal representing a voltage signal and further comprising the step of measuring the impedance between said first current test signal and said second voltage test signal by selecting the impedance measuring function on said function control means, said impedance being determined from the ratio of said second voltage test signal to said first current test signal to said first test current signal at a given harmonic frequency thereof.

11. The method of claim 10 wherein said first current test signal and said second voltage test signal are from multi-phase branches of a multi-phase network, the step of measuring impedance of one branch of the multi-phase network, further comprising measuring the impedance of said test signals at each phase of said multi-phase signals and comparing said impedances between said phases to determine the balance in said multi-phase network, a balanced condition being defined as equality of the impedances between different phases in said network.

12. The method of claim 1 wherein the step of selecting a first and second test signal comprises selecting a first test signal and selecting a second test signal and wherein the step of creating a new data set having quadrature coupling calculated from said test signals and the harmonic components of said test signals, wherein said test signals comprise two distorted test signals having all harmonic frequencies and are embedded in noise, includes summing the product of said first signal with selected harmonic components of said second signal plus the product of the second test signal with the same order of harmonic component of the first test signal plus a weighted product of said first and second test signals.

13. The method of claim 1 wherein the third-order cumulant (third-moments sequence) $c_y(k,l)$ of a data stream $y(n)$ is defined by $$c_y(k,l) = E\{y(n)y(n+k)y(n+l)\};$$

where E is the expectation operator, $y(n)$ is the sampled test signal data, at $t=nT$, $y(n+k)$ is the test signal sampled at time $(n+K)T$, and $y(n+l)$ is the test signal sampled at time $(n+1)T$.

14. The method of claim 1 of calculating said phase shifts between said harmonic components of said test signals using said third-order cumulants of the new data set, wherein said test signals are two distorted test signals having all harmonic frequencies, both said test signals being embedded in noise.

15. The method of claim 1 wherein the step of providing a signal processing apparatus having a signal processing means further comprises providing a signal processing means comprising first and second floating-point digital signal processing integrated circuit chips and wherein the step of computing said series of N linear autocorrelation functions further comprises computing said functions by said first floating-point digital signal processing integrated circuit and wherein the step of computing said third-order cumulants comprises computing said cumulants by said second floating-point digital signal processing integrated circuit.

16. The method of claim 1 wherein said test signals represent the applied input voltage and the current and are contaminated with noise further including the step of computing apparent, active and/or reactive power in said test signals.

17. A method of measuring the phase angles between fundamental components of two input test signals one of which is distorted containing all harmonic components and the other is undistorted containing only the DC and fundamental frequency and both embedded in measurement noise and measuring phase shift of the harmonic components of the distorted test signal comprising:

providing a signal processing apparatus for determining phase angles between any fundamental components of two of the incoming test signals the apparatus having a signal processing means, multiplexer means for selectively choosing a first and second test signal from a plurality of incoming test signals, interface means electrically connected to said signal processing means and to said multiplexer means for converting said selected first and second test signals for input to said signal processing means, computation control means electrically connected to said interface means and said signal processing means for controlling the input of said first and second test signals to said signal processing means and the processing of said test signals by said signal processing means, function control means electrically connected to said computation control means for providing function control of said signal processing means and for output of processed test signal data;

selecting a first and second incoming input test signal from a plurality of input test signals by said multiplexer means wherein said first test signal comprises a sinusoidal test signal having only a fundamental frequency and DC components and wherein said second test signal comprises a distorted test signal having DC and all harmonic components;

converting said first and second test signals by said interface means into a proper digitized format for processing by said signal processing means;

inputting said converted first and second digitized test signals into said signal processing means;

computing two autocorrelation function values for said first test signal and N autocorrelation function values for said second test signal by said signal processing means, where N-1 is the number of harmonic orders;

determining DC components of said first and second digitized test signals and harmonic components of said second digitized test signal using said autocorrelation function values;

filtering said first and second digitized test signals by removing the DC components therefrom thereby producing first and second filtered test signals;

creating a new data set from said filtered test signals wherein said new data set has quadratic coupling calculated from said filtered test signals and their harmonic components;

calculating third-order cumulants of said new data set;

computing phase shift between fundamental frequency components of said filtered test signals using said third-order cumulants and phase shift of harmonic components of said distorted test signal; and outputting results of signal processing of said test signals by said function control means.

18. The method of claim 17 wherein the step of creating a new data set having quadrature coupling calculated from said test signals and their harmonic components, wherein said test signals comprise a first sinusoidal test signal having only the fundamental frequency and a second distorted test signal having all harmonic frequencies, includes summing the product of said second signal and the effective value of said first signal, plus the product of the effective value of said first signal with the sum of the harmonic components of said second signal plus a weighed product of said first and second signals.

19. The method of claim 18 of calculating said phase shifts between said harmonic components of said test signals or absolute phase shifts of harmonic components using said third-order cumulants of the new data set, wherein said test signals comprise a first sinusoidal test signal having only a fundamental frequency and a second distorted test signal having all harmonic frequencies, both said test signals being embedded in noise.

20. An apparatus for measuring the phase angles between two test signals wherein at least one test signal is a distorted test signal embedded in noise harmonic components and being comprising:

multiplexer means for selectively choosing a first and second test signal from a plurality of incoming test signals;

a signal processing means;

interface means electrically connected to said signal processing means and to said multiplexer means for converting said selected first and second test signals for input to said signal processing means;

computation control means electrically connected to said interface means and said signal processing means for controlling the input of said first and second test signals to said signal processing means and the processing of said test signals by said signal processing means;

function control means electrically connected to said computation control means for providing control to said signal processing means and for display of said processed signal data, wherein said first and second test signals are processed by said signal processing means allowing computation of various relationships between said first and second test signals thereby allowing the retrieval and display of data contained within said first and second test signals otherwise obscured by noise.

21. The apparatus of claim 20 wherein said signal processing means computes harmonic components of said first and second test signals by simultaneous solution of the autocorrelation functions $R_y(k)$ of a data stream $y(n)$ computed by $$R_y(k)=E\{y(n)y(n+k)\};$$

where E is the expectation operator and where a sequence $y(n)$ is obtained by periodically sampling an analog test signal and wherein said signal processing means computes the quadratic phase coupling between harmonic components using the third-order cumulant $c_y(k,l)$, defined by $$c_y(k,l)=E\{y(n)y(n+k)y(n+l)\};$$

where $y(n)$ is a data stream of new data set and E is the expectation operator.

22. The apparatus of claim 20 wherein said signal processing means comprises a first and second digital signal processor, said first digital signal processor being operative to compute the harmonic components of said first and second said test signals and said second digital signal processor being operative to compute phase shifts between said harmonic components of said first and second test signals.

23. The apparatus of claim 22 wherein said interface means comprises a first and second analog-to-digital converter wherein said selected first and second test signals from said multiplexer are converted from analog format to a digital format by said first and second analog-to-digital converters respectively for processing by said first digital signal processor and wherein said interface means further include a digital-to-analog converter for converting digital output of said first digital signal processor to analog format.

24. The apparatus of claim 23 wherein said function control means includes a keyboard and display for communication between the operator and the apparatus wherein various operational parameters may be entered into the apparatus and various output data may be displayed to the operator and wherein said control means further includes a general purpose interface bus to facilitate communication of the apparatus with other devices.

25. The apparatus of claim 22 wherein said signal processing means comprises a floating point signal processor chip operative to compute the harmonic components and corresponding phase shifts of said first and said second test signals.

26. The apparatus of claim 20 wherein said signal processing means computes the crosscorrelation of said first and second test signals of data streams, $x(n)$ and $y(n)$, computed by $$R_{xy}(k)=E\{x(n)y(n+K)\};$$

where E is the expectation operator and where sequences $x(n)$ and $y(n)$ are obtained by periodically sampling the multiplexed analog signals.

27. The apparatus of claim 26 further comprising a host processing means electrically connected to said signal processing means, wherein said host processing means is operative to calculate the range or velocity of a target by calculating the time difference between emitted wave and echoes using crosscorrelations of the peak of said crosscorrelation function of emitted and reflected first and second test signals.

28. The apparatus of claim 27 for radar applications for finding the position, velocity profile of a moving body using said digital signal processing means.

29. The apparatus of claim 20 wherein said apparatus is a digital multi-meter operative to compute current, voltage, impedance, active power, and reactive power.

30. The apparatus of claim 20 wherein said apparatus is a signal synthesizer operative to compute amplitude at different frequencies, frequency, phase shifts between harmonics, noise canceling filtering of input wave forms, and measuring selected harmonics.

31. The apparatus of claim 20 wherein said apparatus is used for telecommunication applications as to find percentage modulation in transmitting communication units and demodulation of the received signals using digital signal processing means or to find digital time-of-flight measurement of ultrasonic sensors to measure object distance in air and flow velocity.

32. A method of measuring the phase angles between any of two digitized input test signals having DC and harmonic components and embedded in measurement noise comprising:

providing a signal processing apparatus for determining phase angles between harmonic components of any two of the incoming test signals, the apparatus having a signal processing means, a host processor connected to said signal processing means, computation control means electrically connected to said signal processing means and software means for selecting a first and second test signal and forwarding said first and second test signals to said signal processing means and the processing of said test signals by said signal processing means, function control means electrically connected to said computation control means for providing function control of said signal processing means and output of processed test signals data;

selecting a first and second digitized test signals by said software means;

inputting said selected first and second digitized test signals into said signal processing means;

computing a series of N linear autocorrelation function equations for each of said first and second digitized test signals by said signal processing means, where N is the number of harmonic orders;

determining DC and harmonic components of said first and second digitized test signals by simultaneously solving said N linear autocorrelation function equations;

filtering said first and second digitized test signals by removing the DC components therefrom, thereby producing first and second filtered test signals;

creating a new data set from said filtered test signals wherein said new data set has quadratic coupling between said harmonic components of said filtered test signals for a chosen harmonic order;

calculating third-order cumulants of said new data set;

computing phase shift between said harmonic components using said third-order cumulants; and outputting results after further signal processing of said test signals by said function control means and said host processor.

33. A method of measuring the phase angles between first and second digitized input test signals having DC and harmonic components and embedded in measurement noise comprising:

providing a signal processing apparatus for determining phase angles between harmonic components of said first and second incoming test signals, the apparatus having a signal processing means, computation control means electrically connected to said signal processing means and function control means electrically connected to said computation control means for providing function control of said signal processing means and output of processed test signals data;

inputting said selected first and second digitized test signals into said signal processing means;

computing a series of N linear autocorrelation function equations for each of said first and second digitized test signals by said signal processing means, where N-1 is the number of harmonic orders;

determining DC and harmonic components of said first and second digitized test signals by simultaneously solving said N linear autocorrelation function equations;

filtering said first and second digitized test signals by removing the DC components therefrom, thereby producing first and second filtered test signals;

creating a new data set from said filtered test signals wherein said new data set has quadratic coupling between said harmonic components of said filtered test signals for a chosen harmonic order;

calculating third-order cumulants of said new data set;

computing phase shift between said harmonic components using said third-order cumulants; and outputting results after further signal processing of said test signals by said function control means.

\* \* \* \* \*